(12) United States Patent
Lee et al.

(10) Patent No.: US 9,373,791 B2
(45) Date of Patent: Jun. 21, 2016

(54) HOLE TRANSPORT POLYMERIC COMPOUND AND POLYMER LIGHT EMITTING DIODE USING THE SAME

(71) Applicant: GWANGJU INSTITUTE OF SCIENCE AND TECHNOLOGY, Gwangju (KR)

(72) Inventors: Jae-Suk Lee, Gwangju (KR);
Beom-Goo Kang, Gwangju (KR);
Chang-Lyoul Lee, Gwangju (KR);
Kwanghee Lee, Gwangju (KR);
Hongkyu Kang, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 533 days.

(21) Appl. No.: 13/933,890

(22) Filed: Jul. 2, 2013

(65) Prior Publication Data

US 2014/0008622 A1 Jan. 9, 2014

(30) Foreign Application Priority Data

Jul. 2, 2012 (KR) .......................... 10-2012-0071939

(51) Int. Cl.
*H01L 51/50* (2006.01)
*H01L 51/00* (2006.01)

(52) U.S. Cl.
CPC .......... *H01L 51/0043* (2013.01); *H01L 51/004* (2013.01); *C08G 2261/135* (2013.01); *C08G 2261/3142* (2013.01); *C08G 2261/3223* (2013.01); *C08G 2261/3246* (2013.01); *C08G 2261/512* (2013.01); *C08G 2261/592* (2013.01); *C08G 2261/76* (2013.01); *C08G 2261/95* (2013.01); *H01L 51/0059* (2013.01); *H01L 51/5056* (2013.01)

(58) Field of Classification Search
None
See application file for complete search history.

(56) References Cited

PUBLICATIONS

Rangel-Rojo et al., Spectrally resolved thrid-order nonlininearities in polydiacetylene microcrystals: influence of particle size, 1998, Journal of the Optical Society of America B Optical Physics, pp. 2937-2945.*
Beom-Goo Kang et al., Synthesis of Cross-Linkable Hole-Transporting Material Containing Triphenylamine Moieties by Anionic Polymerization and Its Application in OLEDs, 2011 Fall Meeting of the Korean Chemical Society, Daejeon, Republic of Korea, 20110928-20110930.

(Continued)

*Primary Examiner* — Gregory Clark
(74) *Attorney, Agent, or Firm* — Hauptman Ham, LLP

(57) ABSTRACT

A hole transport polymeric compound and a polymer light emitting diode using the same. The hole transport polymeric compound includes a hole transport material, a thermal cross-linking agent containing an ethynyl group, and a compound represented by [Formula 1], and can be applied to a polymer light emitting diode. In addition, the hole transport polymeric compound has excellent hole transport capabilities and has stability in solvents so as to be insoluble in a solvent used upon stacking other organic layers and blocking electrons well.

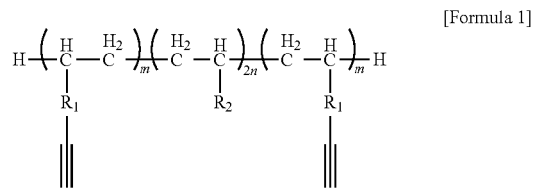

[Formula 1]

15 Claims, 18 Drawing Sheets

(56) References Cited

PUBLICATIONS

Beom-Goo Kang et al., Preparation of Novel Cross-Linkable Hole-Transporting Material by Anionic Polymerization and Its Application in OLEDs, 2011 Fall Scholarship Seminar of the Polymer Society of Korea, Gwangju, Republic of Korea, 20111006-20111007.

Beom-Goo Kang et al., Synthesis of Thermally Cross-linkable Block Copolymer Containing Triphenylamine Moiety by Anionic Polymerization and Its Application in OLEDs, The 12th Pacific Polymer Conference, Jeju Island, Republic of Korea, 20111113-20111117.

Beom-Goo Kang et al., Thermally crosslinkble hole transporting layer replacing PEDOT:PSS layer for realizing highly efficient PLED by all solution process, The 7th International Conference on Advanced Materials and Devices (ICAMD 2011), Jeju Island, Republic of Korea, 20111207-20111209.

Beom-Goo Kang et al., A new alternative hole-transporting layer to PEDOT:PSS for realizing highly efficient all solution-processable PLEDs, The 42nd Winter Annual Conference of the Korean Vacuum Society, Pyeongchang, Republic of Korea, 20120208-20120210.

Beom-Goo Kang et al., A new thermally cross linkable hole-transporting polymer synthesized by living anionic polymerization and its PLEDs application, 2012 Spring Scholarship Seminar of the Polymer Society of Korea, Daejeon, Republic of Korea, 20120412-20120413.

* cited by examiner

HOLE TRANSPORT POLYMERIC COMPOUND AND POLYMER LIGHT EMITTING DIODE USING THE SAME

CROSS-REFERENCE TO RELATED APPLICATION

This application claims priority to Korean Patent Application No. 10-2012-0071939 filed on 2 Jul., 2012, and all the benefits accruing therefrom under 35 U.S.C. §119, the contents of which is incorporated by reference in its entirety.

BACKGROUND

1. Technical Field

The present invention relates to a hole transport polymeric compound, which has excellent hole transport capabilities, exhibits stability in organic solvents so as to be insoluble in the organic solvents used upon stacking other organic layers, and can efficiently block electrons, and a polymer light emitting diode using the same.

2. Description of the Related Art

In modern fields such as IT and electronics, photo-electronic devices based on conversion of light energy into electric energy or vice versa are very important.

With various merits, such as easy and inexpensive solution process, excellent luminance, rapid response, flexibility, and the like, polymer light emitting diodes (PLEDs) have been actively studied for development of next generation flat panel displays.

Efficiency of PLEDs substantially depends on charge equilibrium, electron blocking and exciton quenching properties. These requirements are achieved by a multilayer structure including functional layers, such as a hole injecting layer (HIL), hole transport layer (HTL), electron blocking layer (EBL), electron emission layer (EML), hole blocking layer (HBL), and electron transfer layer (ETL). Particularly, to realize highly efficient PLEDs, there is a need for the development of an appropriate hole transport layer, for confining excitons in the emission layer by maximizing hole injection and electron blocking. In addition, the hole injection layer serves to prevent exciton quenching near an interface between the emission layer and an electrode, thereby improving PLED efficiency.

Manufacture of PLEDs having such a multilayer structure is difficult as compared with organic light emitting diodes because previously formed layers can be damaged or dissolved by a solvent used for spin coating of a new layer.

Therefore, materials having excellent conductivity and providing suitable solubility, such as poly(3,4-ethylenedioxythiophen):poly(styrene sulfonate) (PEDOT:PSS), have been widely used for the hole injection layer and the hole transport layer of the PLED. PEDOT:PSS has many disadvantages such as deficiency in interfacial adhesion, hole transport capabilities and electron blocking capabilities, exciton quenching at the interface of the emission layer, and the like. Moreover, PEDOT:PSS has acidity and corrodes a surface of indium tin oxide (ITO), thereby causing serious problems in terms of long-term stability of the PLED.

To overcome these problems, Morgado et al. reported that insertion of poly(p-phenylenevinylene) (PPV) between PEDOT:PSS and an emission layer resulted in increase in efficiency of a fluorine-based PLED by almost two times (J. Morgado, R. H. Friend, F. Cacialli, *Appl. Phys. Lett.* 2002, 80, 2436.), and Kim et al. reported that formation of a thin (~10 nm) semiconducting polymer interlayer (poly(2,7-(9,9-di-n-octylfluorene)-alt-(1,4-phenylene-((4-sec-butylphenyl)imino)-1,4-phenylene) (TFB)) between the PEDOT:PSS and the emission layer resulted in substantial increase in efficiency of the PLED (J.-S. Kim, R. H. Friend, I. Grizzi, J. H. Burroughes, *Appl. Phys. Lett.* 2005, 87, 023506.).

However, although efficiency and lifespan of PLEDs could be improved by overcoming the disadvantages of PEDOT:PSS, there are problems in that insertion of an intermediate layer entails complex processes and increases manufacturing costs.

Therefore, there is a need for novel hole transport materials, which have excellent hole transport capability, and exhibit stability in organic solvents so as to be insoluble in organic solvents used upon stacking other organic layers.

BRIEF SUMMARY

It is one aspect of the present invention to provide a hole transport polymeric compound, which has excellent hole transport capabilities, exhibits stability in organic solvents so as to be insoluble in the organic solvents used upon stacking other organic layers, and can efficiently block electrons.

It is another aspect of the present invention to provide a method for preparing a hole transport polymeric compound.

It is a further aspect of the present invention to provide a polymer light emitting diode employing the thermally cross-linked hole transport polymeric compound.

In accordance with one aspect of the present invention, a hole transport polymeric compound is represented by [Formula 1]:

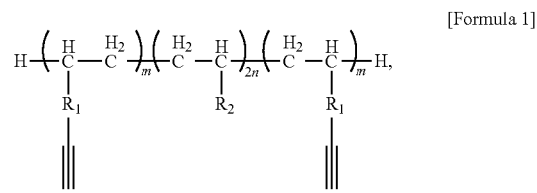

[Formula 1]

wherein $R_1$ is selected from the group comprised of a $C_1$ to $C_{30}$ alkyl group, a $C_6$ to $C_{40}$ aryl group, and a $C_2$ to $C_{30}$ heteroaryl group including N, O or S; $R_2$ is a hole transport material and is selected from the group comprised of a substituted or unsubstituted triphenyl amine and a substituted or unsubstituted carbazole; and each of m and n is an integer from 1 to 50.

A substituent to triphenyl amine and carbazole of $R_2$ may be selected from the group comprised of a $C_6$ to $C_{40}$ aryl group, a $C_2$ to $C_{30}$ heteroaryl group including N, O or S, and a triphenyl amine group.

More particularly, $R_2$ may be selected from the group comprised of hole transport compounds represented by [Formula 2] to [Formula 5].

[Formula 2]

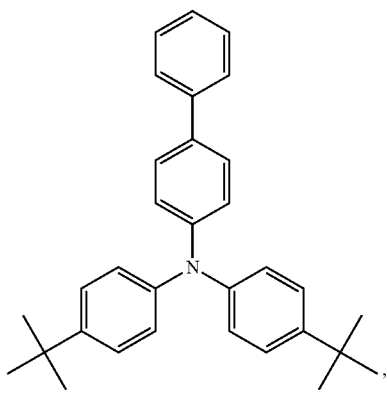

[Formula 3]

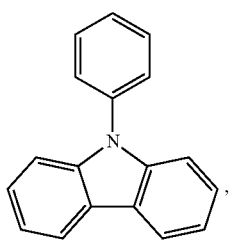

[Formula 4]

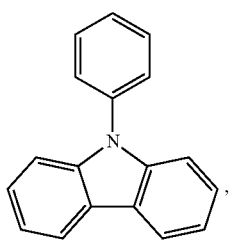,

[Formula 5]

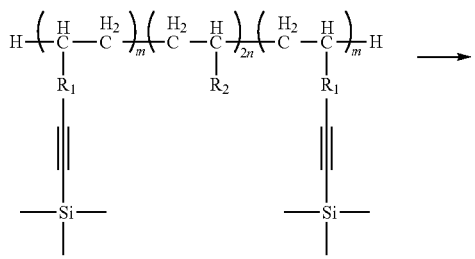

The hole transport polymeric compound represented by [Formula 1] may be polymerized by anionic polymerization or radical polymerization.

In accordance with another aspect of the present invention, a method for preparing a hole transport polymeric compound includes preparing a hole transport polymeric compound represented by [Formula 1] by reacting a compound represented by [Formula 8] with tetra-n-butylammonium fluoride according to <Reaction Formula 1>:

<Reaction Formula 1>

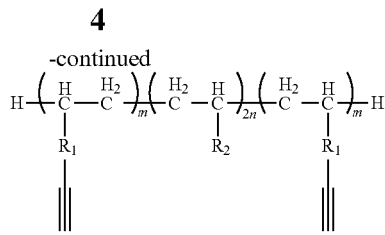

[Formula 8]

[Formula 1]

The compound represented by [Formula 8] may be prepared by reacting a polymer, in which compounds represented by [Formula 6] are continuously formed, with a compound represented by [Formula 7] in the presence of potassium naphthalenide, sec-butyllithium (sec-BuLi), or a radical initiator according to <Reaction Formula 2>:

<Reaction Formula 2>

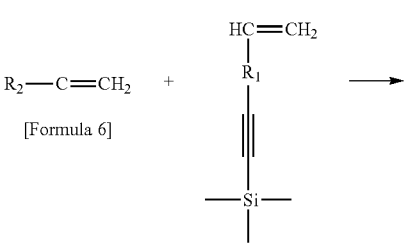

[Formula 6]          [Formula 7]

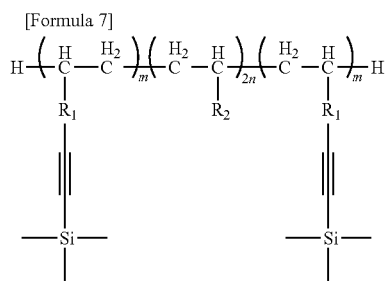

[Formula 8]

The polymer may be prepared by reacting the compound represented [Formula 6] with potassium naphthalenide, sec-butyllithium (sec-BuLi), or a radical initiator.

The compound represented by [Formula 6] and the compound represented by [Formula 7] may be mixed in a molar ratio from 1:0.2 to 1:0.8.

$R_2$ may be selected from the group comprised of compounds represented by [Formula 2] to [Formula 5].

In accordance with a further aspect of the present invention, a polymer light emitting diode includes: a first electrode; an organic material layer comprised of at least 2 layers including an emission layer; and a second electrode, sequentially stacked in this order, wherein at least one layer in the organic material layer includes the compound represented by [Formula 1].

The compound represented by [Formula 1] may be thermally cross-linked on the first electrode.

The thermal cross-linking may be performed at 200° C. to 300° C. for 10 minutes to 60 minutes.

The emission layer may have a thickness from 10 nm to 100 nm.

The organic material layer may include a hole transport layer, wherein the hole transport layer is represented by [Formula 1].

The emission layer is comprised of a binary compound of a host material and a phosphorescent or fluorescent dopant, wherein the host material is the compound represented by [Formula 1].

As such, the hole transport polymeric compound has excellent hole transport and electron blocking capabilities, and may have defect-free surfaces.

In addition, the hole transport polymeric compound has stability in organic solvents, and thus is insoluble in organic solvents used upon stacking other organic layers.

Further, a polymer light emitting diode employing the thermally cross-linked hole transport polymeric compound as a hole transport layer may exhibit 1.5 times higher luminance and 4 times higher luminous efficiency than a polymer light emitting diode employing PEDOT:PSS. This is because the cross-linked polymeric compound exhibits excellent properties in terms of electron and exciton blocking capabilities and capability of inhibiting and/or reducing exciton quenching.

Furthermore, since the polymeric compound is not acidic, the polymer light emitting diode employing the thermally cross-linked polymeric compound may have longer lifespan than the polymer light emitting diode employing PEDOT:PSS.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1A:
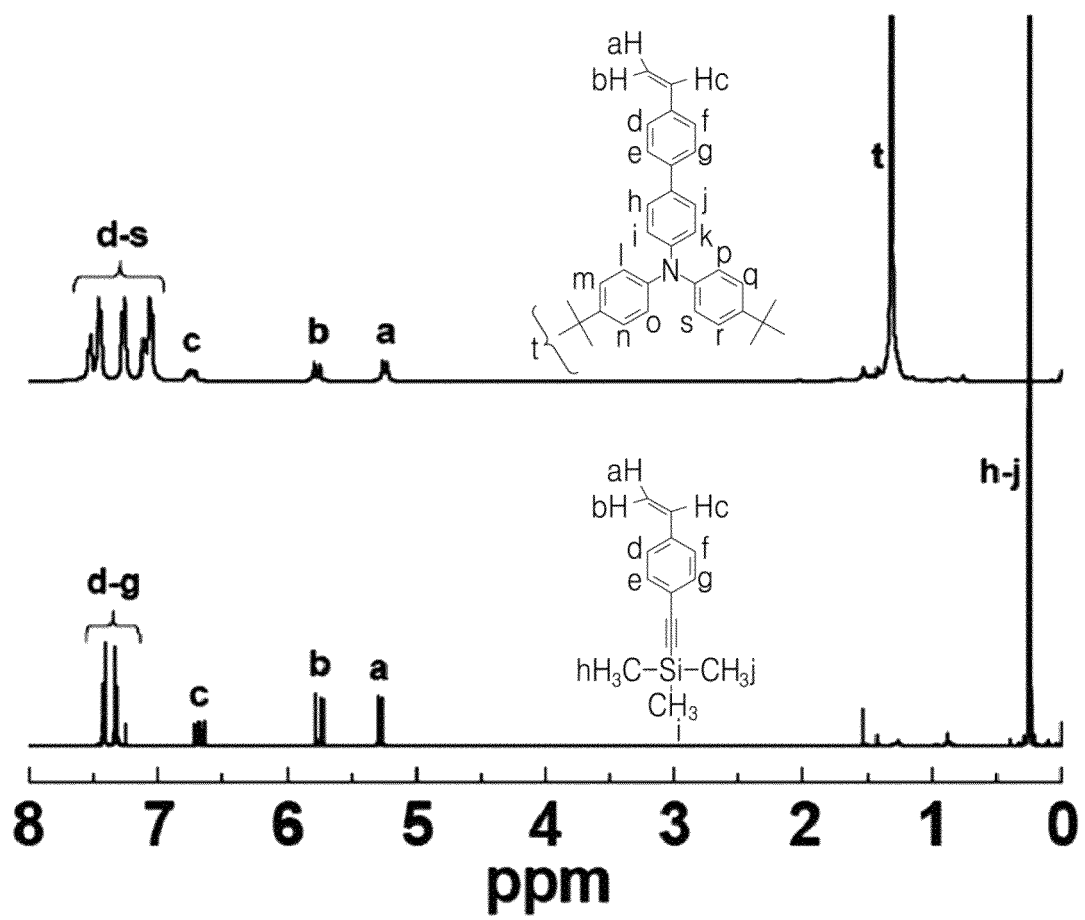
FIGS. 1a and 1b are graphs depicting measurement results of compounds represented by [Formula 9] and [Formula 12], as prepared in inventive examples and measured by $^1$H NMR.

The present invention relates to a hole transport polymeric compound, which has excellent hole transport capabilities, has stability in organic solvents so as to be insoluble in the organic solvents used upon stacking other organic layers, and can efficiently block electrons, and a polymer light emitting diode using the same.

Exemplary embodiments of the present invention will now be described in detail.

It is one aspect of the present invention to provide a hole transport polymeric compound represented by [Formula 1], prepared by reaction between a hole transport material and a thermal cross-linking agent containing an ethynyl group.

[Formula 1]

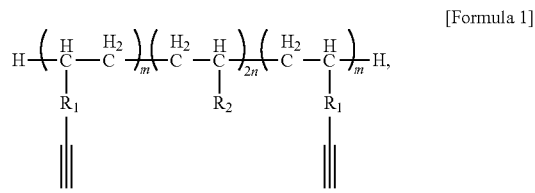

wherein $R_1$ is selected from the group comprised of a $C_1$ to $C_{30}$ alkyl group, a $C_6$ to $C_{40}$ aryl group, and a $C_2$ to $C_{30}$ heteroaryl group including N, O or S; $R_2$ is a hole transport material and is selected from the group comprised of a substituted or unsubstituted triphenyl amine and a substituted or unsubstituted carbazole; and each of m and n is an integer from 1 to 50.

A substituent to triphenyl amine and carbazole of $R_2$ is selected from the group comprised of a $C_6$ to $C_{40}$ aryl group, a $C_2$ to $C_{30}$ heteroaryl group including N, O or S, and a triphenyl amine group. Preferably, $R_2$ is a compound selected from the group comprised of hole transport compounds represented by [Formula 2] to [Formula 5].

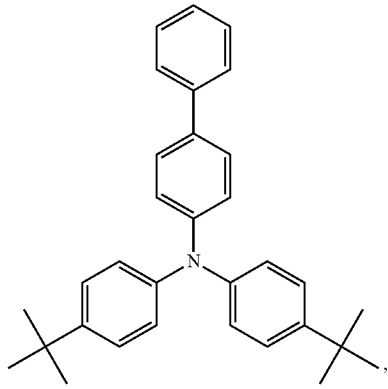

[Formula 2]

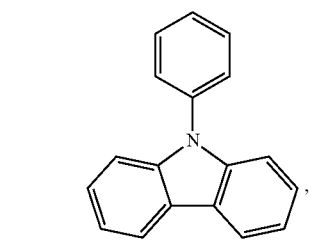

[Formula 3]

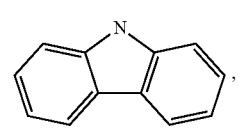

[Formula 4]

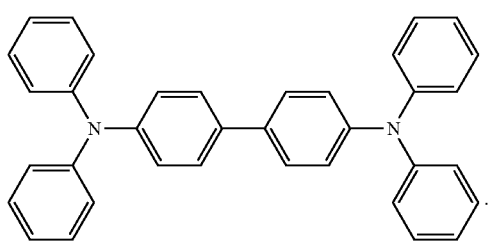

[Formula 5]

The compound represented by [Formula 1] is soluble in organic solvents. However, the compound is stable in the organic solvents after thermal cross-linking, and thus is insoluble in an organic solvent used upon stacking other organic layers.

The compound represented by [Formula 1] may be polymerized by anionic polymerization or radical polymerization.

Since the compound represented by [Formula 1] includes a hole transport material and maintains conjugation by allowing ethynyl groups placed at both terminals of a chain thereof to form a benzene ring through thermal cross-linking, the compound has excellent hole transport capabilities and is prepared by the following process represented by <Reaction Formula A>:

<Reaction Formula A>

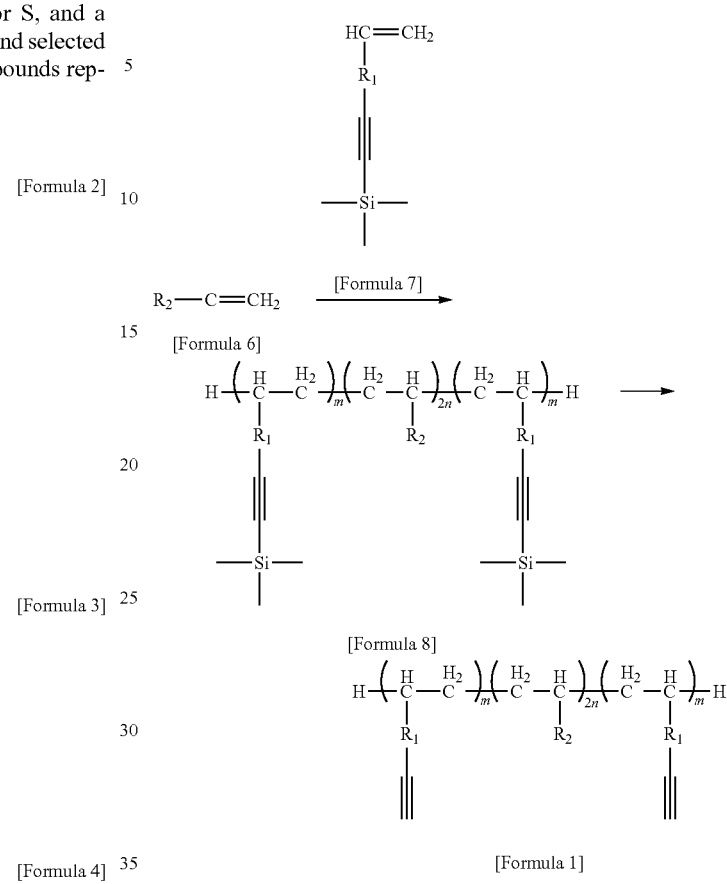

First, in <Reaction Formula A>, a compound represented by [Formula 6], which is the hole transport material, is reacted with potassium naphthalenide, sec-butyllithium (sec-BuLi), or a radical initiator, thereby preparing a block and random copolymerization polymer in which compounds represented by [Formula 6] are continuously formed by living anionic polymerization or radical polymerization.

Next, a thermally cross-linkable polymer represented by [Formula 8] is prepared by reacting the polymer and a monomer compound represented by [Formula 7] with potassium naphthalenide, sec-butyllithium (sec-BuLi), or a radical initiator. At this point, the compound represented by [Formula 6] and the compound represented by [Formula 7] are mixed in a molar ratio from 1:0.2 to 1:0.8, preferably from 1:0.3 to 1:0.5.

Next, a compound represented by [Formula 1], from which a protective group is removed, is prepared by reacting the thermally cross-linkable polymer represented by [Formula 8] with tetra-n-butylammonium fluoride. When the protective group is removed from the compound represented by [Formula 1], an ethynyl group functioning as a thermal cross-linking group is formed.

A structure of such a compound may be determined through $^1$H NMR, FT-IR, and size exclusion chromatography.

The compound represented by [Formula 1] may be applied to a polymer light emitting diode.

Generally, the polymer light emitting diode includes: a first electrode; an organic material layer comprised of at least 2 layers including an emission layer; and a second electrode, sequentially stacked in this order, wherein at least one layer in the organic material layer includes the compound represented by [Formula 1]. The organic material layer is comprised of at least 2 layers among a hole injection layer, a hole transport layer, an electron blocking layer, an emission layer, a hole blocking layer, and an electron transporting layer, and includes at least the hole transport layer and the emission layer.

In the polymer light emitting diode according to one embodiment, the organic material layer includes the hole transport layer, which includes the compound represented by [Formula 1].

The compound represented by [Formula 1] may be thermally cross-linked on the first electrode. Here, thermal cross-linking may be performed at 200° C. to 300° C. for 10 minutes to 60 minutes, without being limited thereto.

The emission layer may have a thickness from 10 nm to 100 nm.

In the polymer light emitting diode, the emission layer is comprised of a binary compound of a host material and a phosphorescent or fluorescent dopant, wherein the host material may employ the compound represented by [Formula 1].

In one example of the polymer light emitting diode according to the embodiment, a substrate may be provided with a thin film transistor (TFT). When the substrate is provided with a TFT, an active matrix type light emitting diode may be prepared, and when the substrate is not provided with a TFT, a passive matrix type light emitting diode may be prepared. In the present invention, any one of the active matrix type and passive matrix type light emitting diodes may be prepared. In addition, the substrate may include any one of glass, plastic, metal foils, and the like, without being limited thereto.

The first electrode placed on an upper surface of the substrate is a transparent electrode and is mainly formed of ITO which has both electrical conductivity and transparency.

The hole transport layer placed on an upper surface of the first electrode may be formed of a compound which has excellent interfacial properties between the hole transport layer and the first electrode, easily provides electrons to the first electrode, and can be coated by spin coating or the like. Preferably, the hole transport layer is formed by coating the compound represented by [Formula 1].

The emission layer placed on an upper surface of the hole transport layer is coated with a polymer ink such as an electroluminescent ink having electroluminescent properties (for example, a red luminescent ink, a green luminescent ink, a blue luminescent ink), by a method such as inkjet printing, spin coating, and the like. Here, an organic solvent is used for easy coating.

The electron transporting layer, which may be formed on an upper surface of the emission layer, is deposited to a thickness from about 200 Å to about 400 Å by vacuum deposition, thereby improving efficiency of the polymer light emitting diode. The electron transport layer may be omitted from the polymer light emitting diode, if necessary.

The electron injecting layer placed on an upper surface of the electron transport layer is generally formed of LiF, and the second electrode (anode) is placed on an upper surface of the electron injecting layer. As the anode, a metal such as Al, Ma, Ag, and the like may be used alone. Alternatively, a LiF/Ca (or Ba, or the like)/Al structure may be used by forming Ca, Ba or the like to a thickness of several dozen nanometers between Lif which is the electron injection layer, and Al which is the anode. After forming the anode, the polymer light emitting diode is completed through an encapsulation process for blocking air.

Although structural features of the compound represented by [Formula 1] according to the invention and the method for manufacturing a polymer light emitting diode using the same have been described above, it should be understood that the present invention is not limited to the above description.

Next, the present invention will be further elucidated from the following examples and comparative examples. It should be understood that these examples are provided for illustration only and are not to be construed in any way as limiting the scope of the invention, and that various modifications, changes, and alterations can be made without departing from the spirit and scope of the invention.

EXAMPLES

Preparative Example 1

Preparation of Hole Transport Polymeric Compound Represented by [Formula 9]

(1-1) Preparation of Compound Represented by [Formula 9]

The compound was prepared according to <Reaction Formula 3>. After 0.32 g (0.013 mmol) of a compound represented by [Formula 12] and 15 ml of anhydrous THF were placed in a reactor and stirred, 10 ml of THF in which 0.1 M of tetra-n-butylammonium fluoride $((C_4H_9)_4NF)$ was dissolved was added to the mixture in the reactor at 0° C. and stirred for 3 hours. After methanol was added to the resultant solution for precipitation and THF/methanol was added thereto for re-precipitation, the resultant was refined and subjected to freeze drying using benzene under a vacuum, thereby obtaining the compound represented by [Formula 9]. Yield was quantitative.

$^1$H NMR (400 MHz, CDCl$_3$): $\delta$=1.05-2.25 (CH$_2$CH and tert-butyl), 3.03 (C≡CH), 6.25-7.35 (triphenylamine and phenyl).

FT-IR (KBr, cm$^{-1}$): 2109 (C≡C of C≡CH), 3296 (CH of C≡CH).

SEC: $M_n$(obsd)=24,300, $M_w/M_n$=1.12.

$M_n$(obsd) and $M_w/M_n$ were measured at 40° C. by SEC using a THF solution of 2% triethylamine as an eluent, and compensated using a commercially available polystyrene standard.

(1-2) Preparation of Compound Represented by [Formula 12]

The compound was prepared according to <Reaction Formula 3>. 0.38 g (0.821 mmol) of a compound represented by [Formula 10], 0.0063 g (0.0368 mmol) of potassium naphthalenide and 10 ml of THF were placed in the reactor and stirred at −78° C. for 30 minutes. After completion of the reaction, 0.061 g (0.307 mmol) of a compound represented by [Formula 11] was added to the mixture in the reactor, followed by stirring at the same temperature for 30 minutes. The compound represented by [Formula 12] was obtained by adding a large amount of methanol to the reaction solution after completion of reaction. Yield was quantitative.

$^1$H NMR (JEOL JNM-ECX400; 400 MHz, CDCl$_3$): $\delta$=0.25 (SiCH$_3$), 1.05-2.25 (CH$_2$CH and tert-butyl), 6.25-7.35 (triphenylamine and phenyl).

FT-IR (Perkins-Elmer Spectrum 2000; KBr, cm$^{-1}$): 1250 (SiCH$_3$), 2159 (C≡CSi(CH$_3$)$_3$).

SEC (Waters M77251, M510): $M_n$(obsd)=25,300, $M_w/M_n$=1.11.

<Reaction Formula 3>

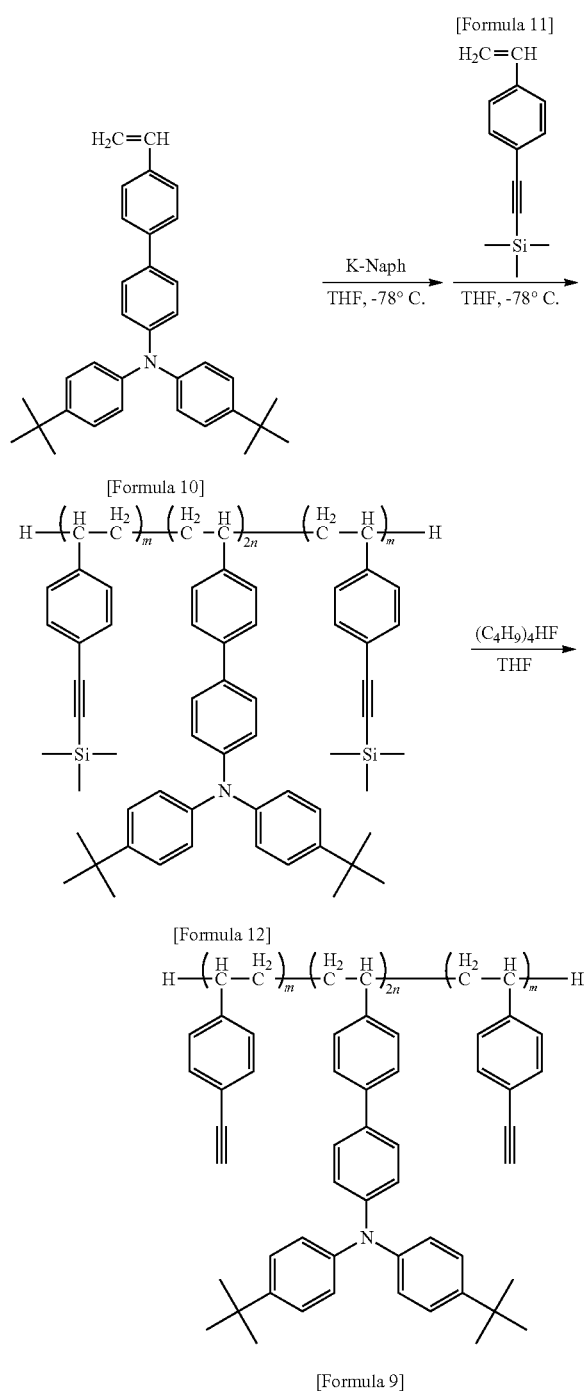

Example 1

Evaluation of Properties of Compound Represented by [Formula 9]

(1-1) $^1$H NMR, FT-IR, and SEC

Figure 1B:
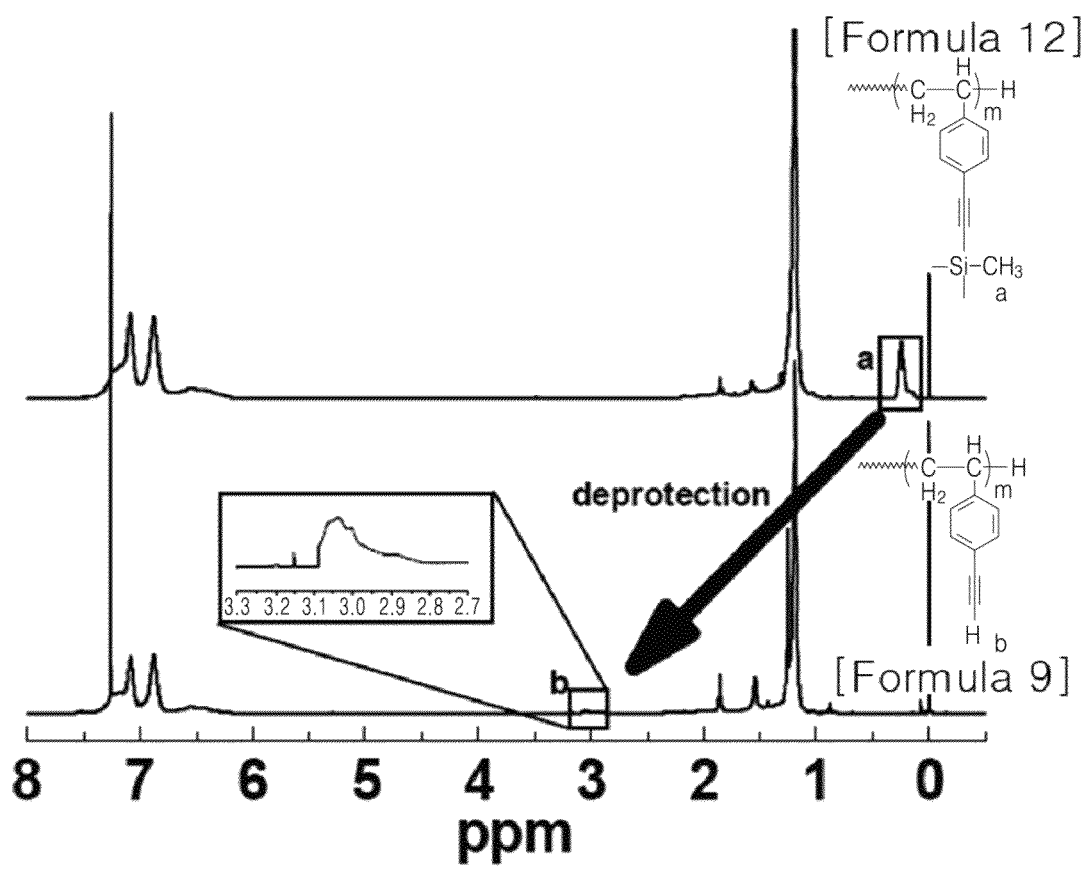
Figure 1C:
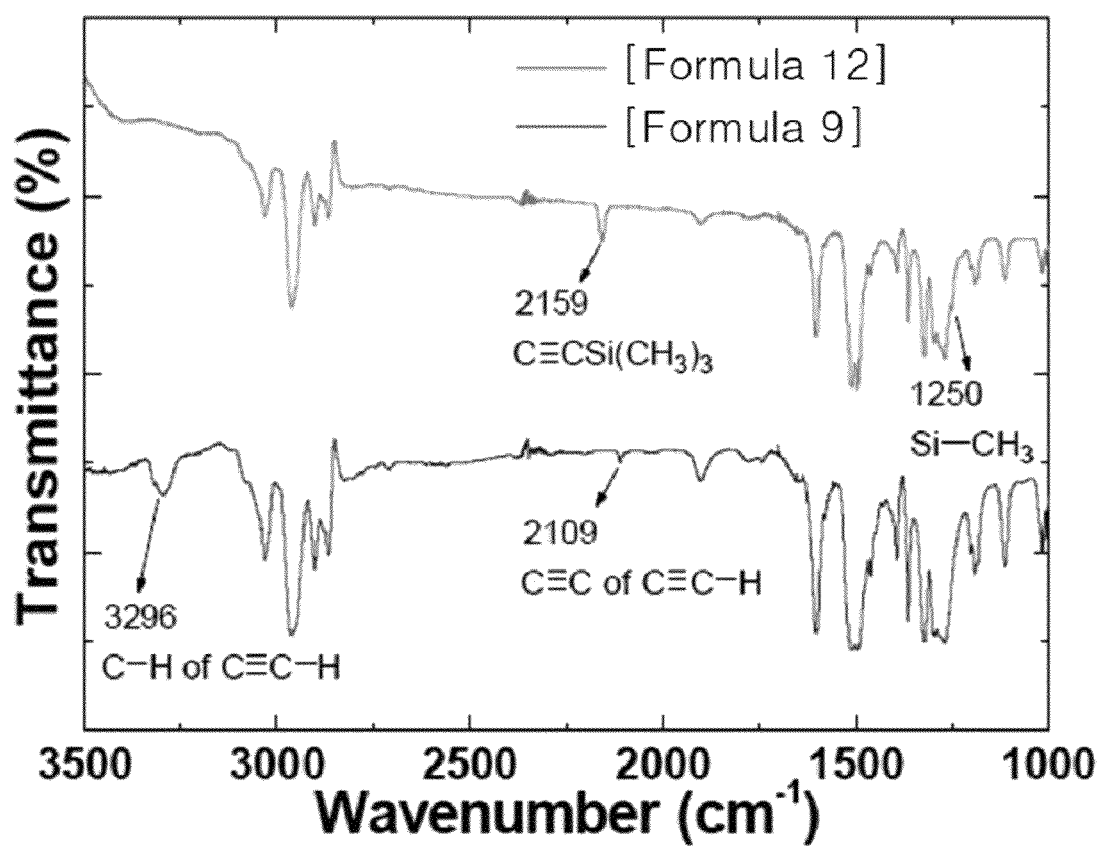
FIG. 1c is a graph depicting measurement results of compounds represented by [Formula 9] and [Formula 12], as prepared in inventive examples and measured by FT-IR.
Figure 1D:
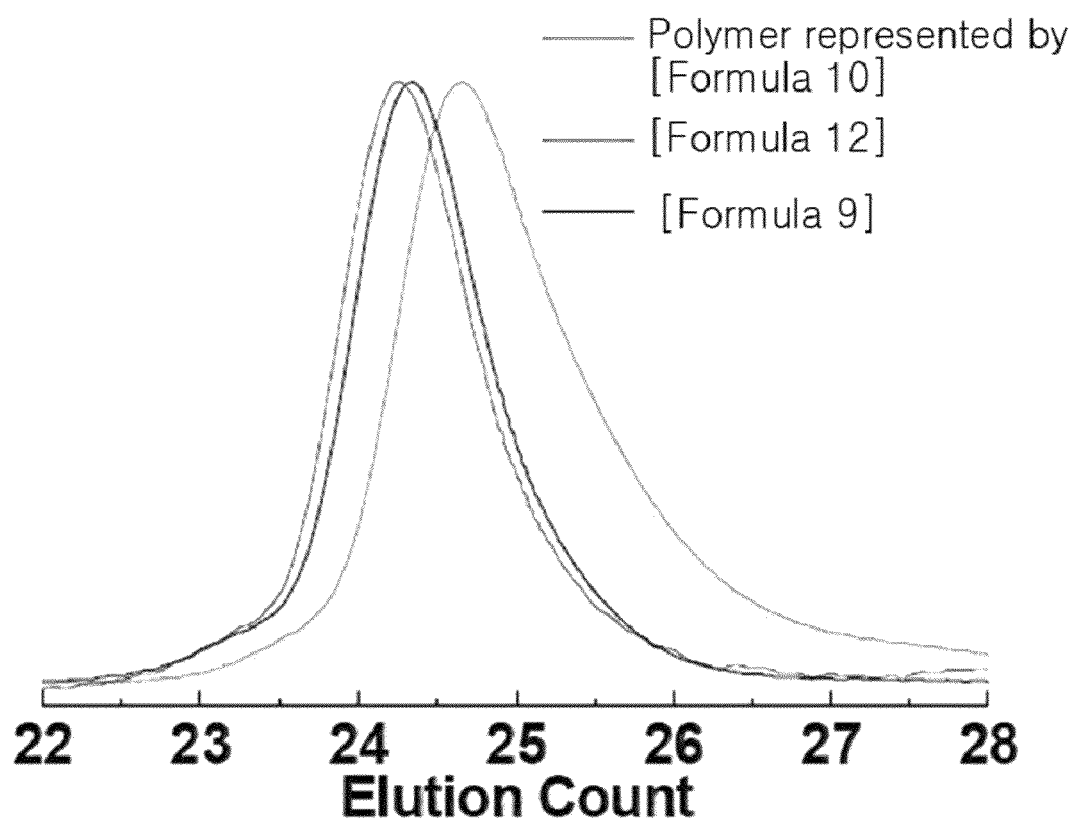
FIG. 1d shows SEC curves of the compounds represented by [Formula 9], [Formula 10] and [Formula 12], as prepared in the inventive examples.

FIGS. 1a and 1b are graphs depicting measurement results of the compounds represented by [Formula 9] and [Formula 12] as measured by $^1$H NMR, FIG. 1c is a graph depicting measurement results of the compounds represented by [Formula 9] and [Formula 12] as measured by FT-IR, and FIG. 1d is a graph depicting SEC curves of the compounds represented by [Formula 9], [Formula 10] and [Formula 12].

As shown in FIGS. 1a and 1b, it can be seen that a peak of a vinyl group disappeared, a wide main peak of a polymer chain and wide peaks of a butyl group and a trimethylsilyl group appeared (upper graph of FIG. 1b), and in the lower graph of FIG. 1b, a peak of methyl protons disappeared and a peak of ethynyl protons appeared at 3.03 ppm.

In addition, as shown in FIG. 1c, bands of $SiCH_3$ (1250 $cm^{-1}$) and $C\equiv CSi(CH_3)_3$ (2159 $cm^{-1}$) disappeared, and new bands were observed at 2109 $cm^{-1}$ ($C\equiv C$ of $C\equiv CH$) and 3296 $cm^{-1}$ (CH of $C\equiv CH$).

Further, as shown in FIG. 1d, it could be seen that the compound represented by [Formula 12] had a measurement value of Mn (predictable molecular weight) of 25,300 similar to a calculated value (Mn=23,900), and the SEC curve had a narrow single-peak shape (Mw/Mn=1.11) and was completely shifted to a higher Mn region than the polymer represented by [Formula 10] which was a starting material. These results mean that a chain terminal derived from the compound represented by [Formula 10] polymerized the compound represented by [Formula 11], and under these polymerization conditions, polymerization of the compound represented by [Formula 11] by the polymer represented by [Formula 10] was successfully performed without side reactions. In addition, the SEC curve of the compound represented by [Formula 9] maintained a single-peak shape, and shifted to a low Mn region. Narrow molecular weights of the compounds represented by [Formula 9] and [Formula 12] are substantially the same, and this result means that side reactions did not occur in the course of removal of the trisilyl group.

Therefore, a copolymer having a triphenylamine group, which can be thermally cross-linked due to successful removal of the trisilyl group, was prepared.

(1-2) Thermogravimetric Analysis (TGA)

Figure 2:
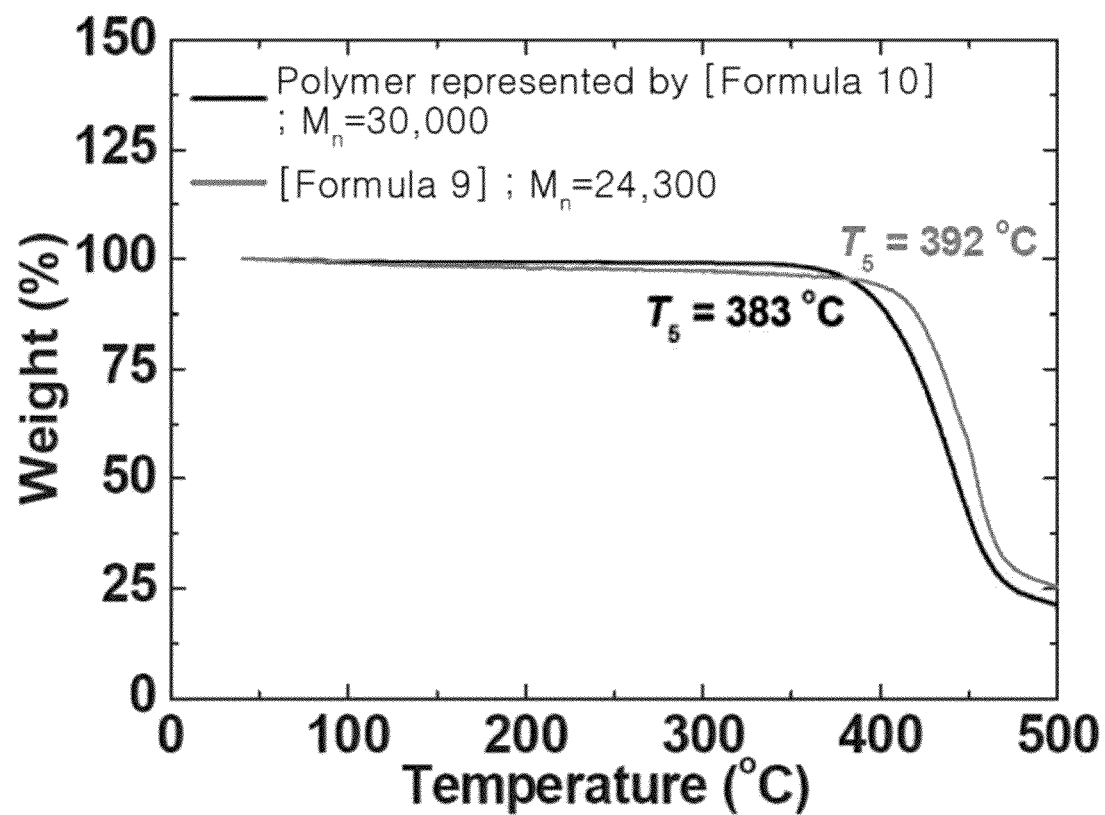
FIG. 2 shows thermal decomposition curves of the compounds represented by [Formula 9] and [Formula 10], as prepared in the inventive examples and measured by thermogravimetric analysis.

FIG. 2 shows thermal decomposition curves of the prepared compounds represented by [Formula 9] and [Formula 10], as measured using a thermogravimetric analyzer (TGA) at a heating rate of 10° C./min under a nitrogen atmosphere.

In FIG. 2, when comparing the compound represented by [Formula 9] with the polymer represented by [Formula 10], which was prepared without using a cross-linking agent, in terms of thermal stability, it can be seen that although the compound represented by [Formula 9] had a lower molecular weight than the polymer represented by [Formula 10], the cross-linked compound represented by [Formula 9] (loss rate of 5 wt % at 392° C.) exhibited higher thermal stability than the polymer represented by [Formula 10] (loss rate of 5 wt % at 383° C.).

Figure 3A:
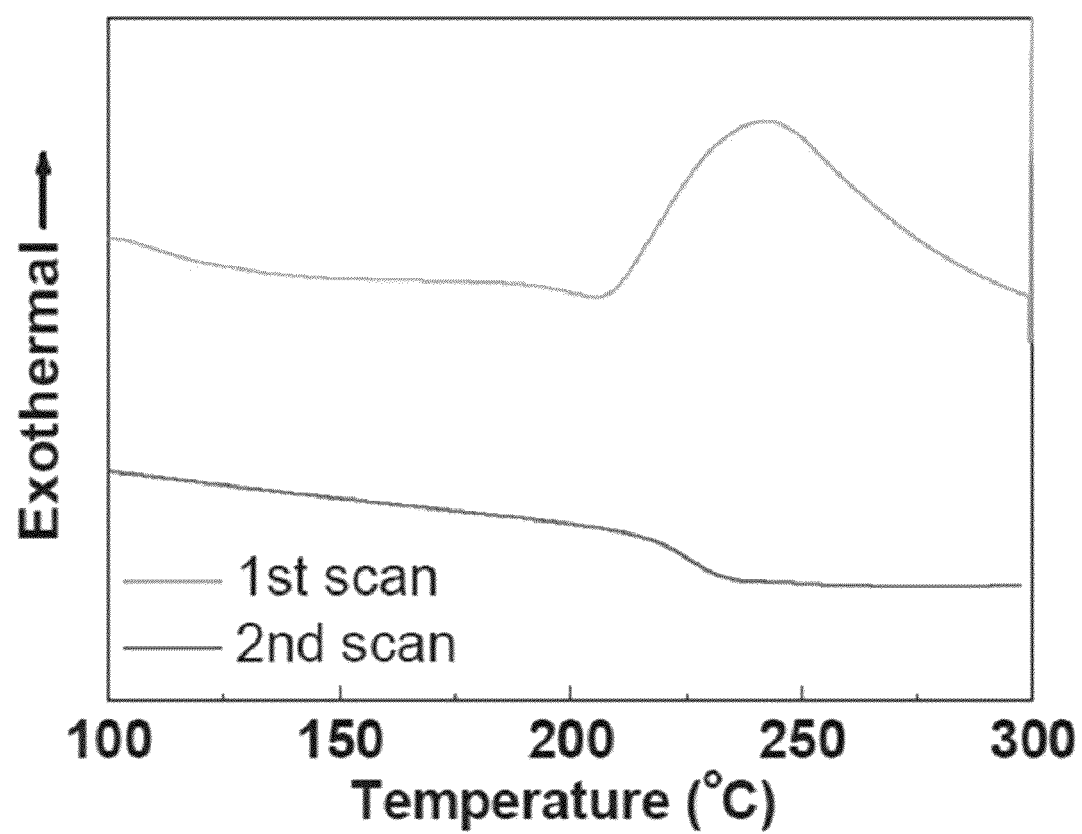
FIG. 3a shows a thermal decomposition curve of the compound represented by [Formula 9], as prepared in the inventive example and measured by differential scanning calorimetry analysis.
Figure 3B:
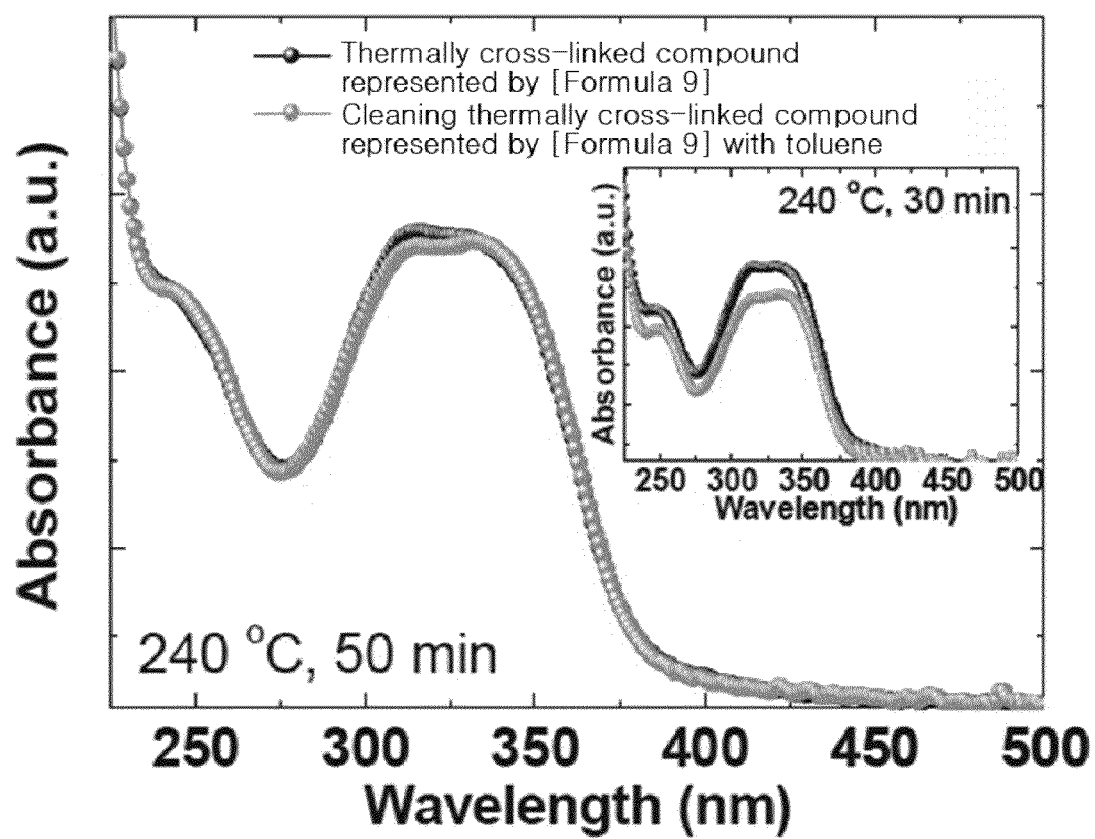
FIG. 3b is a graph depicting states of a cross-linked film before and after cleaning with toluene after cross-linking of the compound represented by [Formula 9], as prepared in the inventive example and measured by UV-Vis absorption spectrum.
Figure 3C:
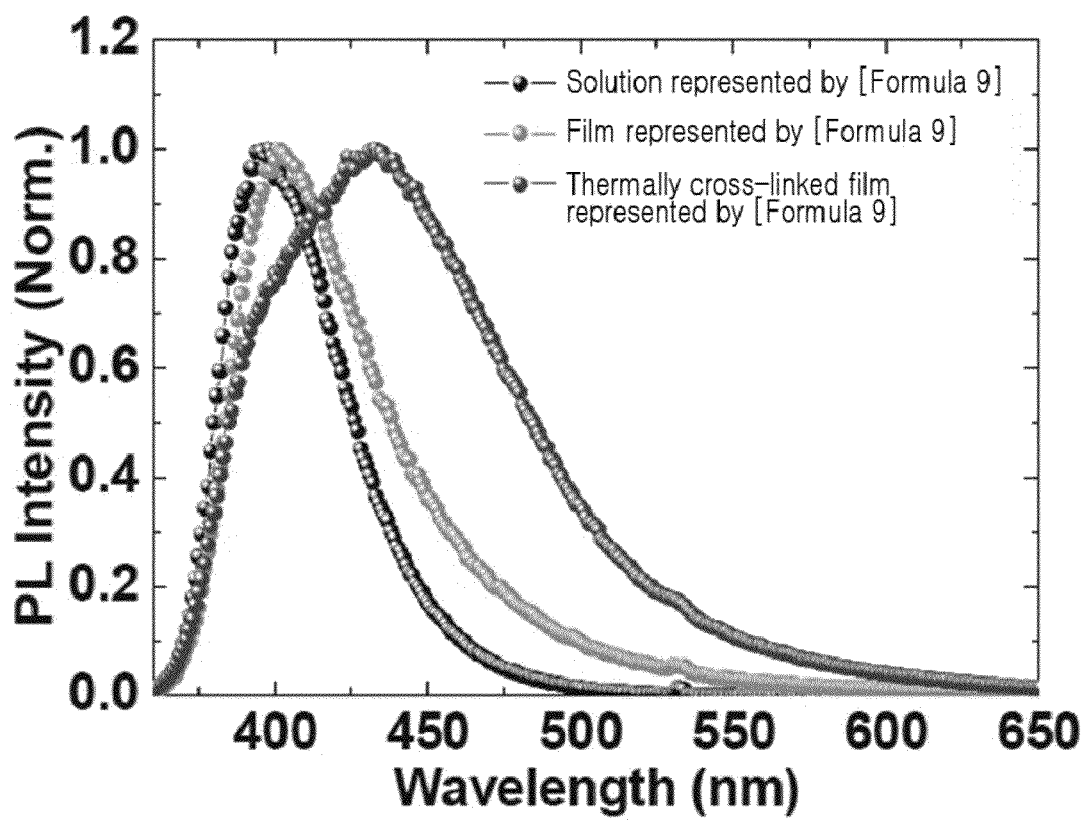
FIG. 3c shows photoluminescence (PL) spectra of the compound (solution) represented by [Formula 9], a film prepared from the compound represented by [Formula 9] and a cross-linked film prepared from the compound represented by [Formula 9]
Figure 3D:
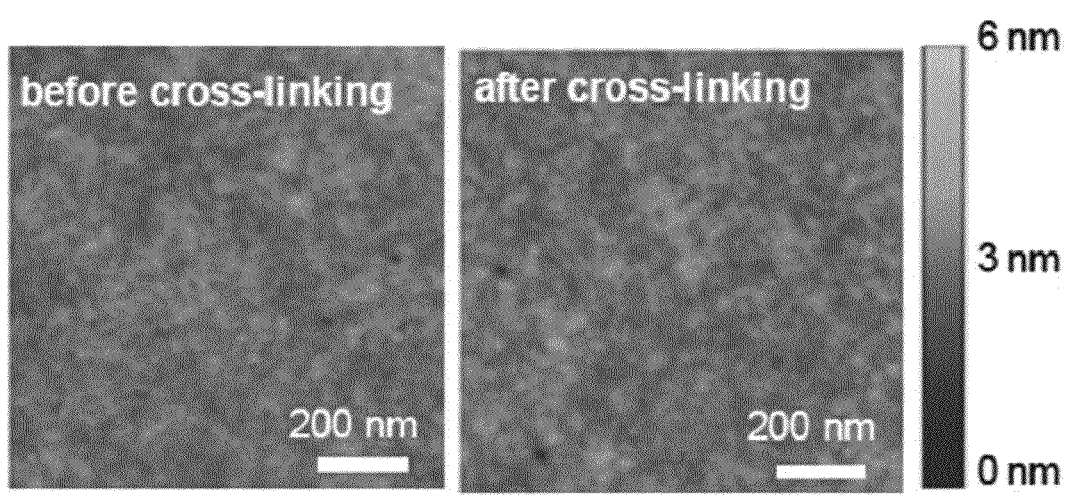
FIG. 3d shows pictures of a film before and after cross-linking, prepared from the compound represented by [Formula 9], as obtained using an atomic force microscope.

(1-3) Differential Scanning Calorimetry (DSC) Analysis, UV-Vis Absorption Spectrum, Photoluminescence Spectrum, and Atomic Force Microscopy Analysis FIG. 3a shows thermal decomposition curves of the compound represented by [Formula 9], as measured by differential scanning calorimetry analysis (DSC) at a heating rate of 10° C./min under a nitrogen atmosphere. FIG. 3b is a graph depicting states of a film prepared by cross-linking the compound represented by [Formula 9] at 240° C. for 50 minutes before and after cleaning with toluene, as measured by UV-Vis absorption spectroscopy (inserted figure: UV-Vis absorption spectrum of a film prepared by cross-linking the compound represented by [Formula 9] at 240° C. for 30 minutes before and after cleaning with toluene). FIG. 3c shows photoluminescence (PL) spectra of the compound (solution) represented by [Formula 9], the film prepared from the compound represented by [Formula 9], and the cross-linked film prepared from the compound represented by [Formula 9]. FIG. 3d shows pictures of films before and after thermal cross-linking at 240° C. for 50 minutes, as obtained by an atomic force microscope (AFM).

As shown in FIG. 3a, after primary scanning, the compound represented by [Formula 9] showed a high exothermic peak within a temperature range from a starting point to 240° C. and had a glass transition temperature (Tg) of 199° C. or less. However, after secondary scanning, the compound represented by [Formula 9] did not show a high exothermic peak within a temperature range from a starting point to 300° C., and the compound has an estimated glass transition temperature (Tg) of 225° C. or less. Increase in glass transition temperature upon secondary scanning above the glass transition temperature upon primary scanning results from thermal cross-linking reaction between ethynyl groups.

As shown in FIG. 3b, when the film represented by [Formula 9], cross-linked at 240° C. for 30 minutes, was treated with toluene, the absorption spectrum was changed. However, when the film represented by [Formula 9] was cross-linked at the same temperature for 50 minutes, there was no change in the absorption spectrum. The absorption spectrum did not change because the film represented by [Formula 9] exhibits strong solvent resistance.

As shown in FIG. 3c, the photoluminescence spectrum of the film represented by [Formula 9] had a wide width and was red-shifted as compared with the solution represented by [Formula 9], and the photoluminescence spectrum of the cross-linked film represented by [Formula 9] was different than that of the film represented by [Formula 9] which was not cross-linked. The main photoluminescence peak of the cross-linked film represented by [Formula 9] appeared at a wavelength of 433 nm, which was red-shifted about 30 nm from that of the film represented by [Formula 9], which was not cross-linked, and the cross-linked film represented by [Formula 9] had a wider full width at half maximum (FWHM) of 100 nm than the film represented by [Formula 9] which was not cross-linked and had a FWHM of 42 nm As a result, it could be seen that aggregation occurred during thermal cross-linking and the density of the film and the packing degree of a chromophore were increased. Once the hole transport layer is aggregated, a hole transfer process due to hopping is promoted or improved with increasing i-electron overlap in the aggregate. In addition, the cross-linked film represented by [Formula 9] has weak photoluminescence intensity and thus can improve color purity of the device by inhibiting formation of excited dimers and/or excited complexes.

As shown in FIG. 3d, the cross-linked film represented by [Formula 9] had a root mean square (RMS) surface roughness of 0.2 nm, and was enough smooth to achieve effective surface planarization of ITO, which has an RMS surface roughness from 3.0 nm to 3.7 nm.

(1-4) Energy Level

Figure 4:
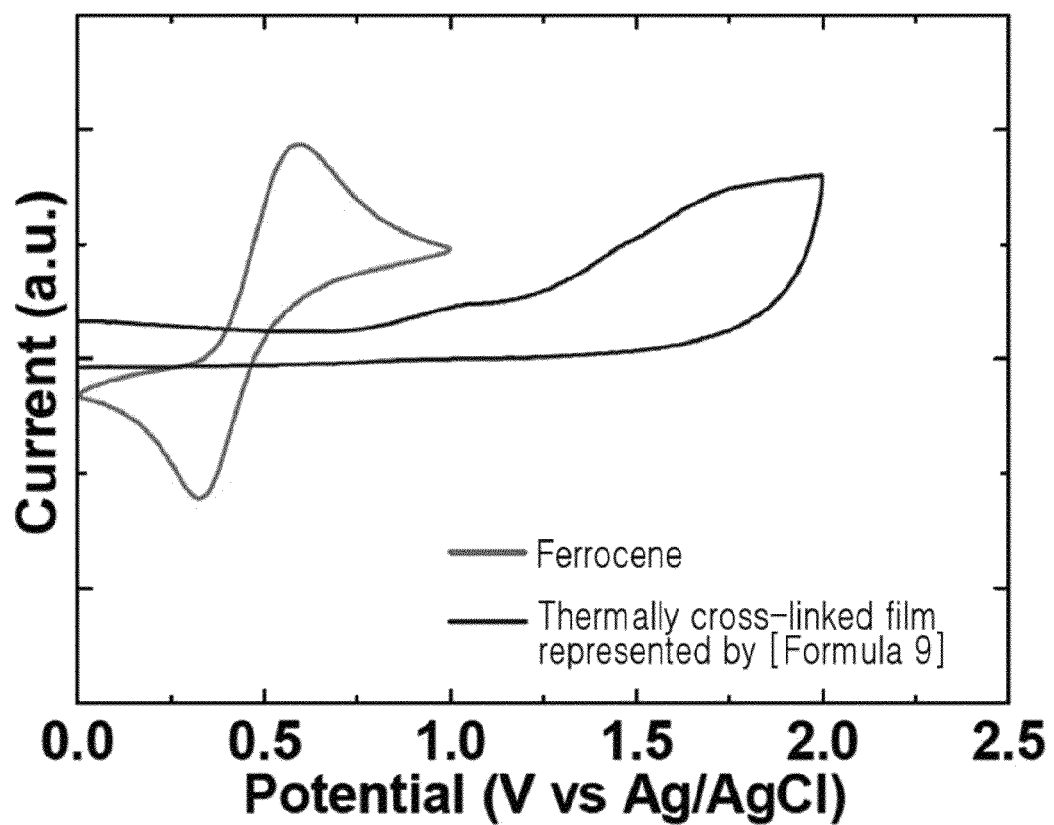
FIG. 4 is a cyclic voltammetry curve of a cross-linked film prepared from the compound represented by [Formula 9]

FIG. 4 is a cyclic voltammetry curve of a cross-linked film prepared from the compound represented by [Formula 9].

As shown in FIG. 4, HOMO and LUMO energy levels of the cross-linked film represented by [Formula 9] were calculated by a cyclic voltammetry (CV) method, and an optical band gap thereof was measured. Here, the HOMO energy level of the cross-linked film represented by [Formula 9] was calculated from an onset oxidation potential ($E_{ox}$(onset)) based on an energy level of ferrocene (4.80 eV) under a vacuum [$E_{HOMO}$(eV)=-$E_{ox}$(onset)-$E_{1/2}$(ferrocene)+4.80 eV]. In addition, the LUMO energy level of the cross-linked film represented by [Formula 9] was determined from a difference between the HOMO energy level and the optical band gap ($E_g$) thereof [$E_{LUMO}$(eV)=$E_{HOMO}$±$E_g$]. $E_{1/2}$ of an Ag/AgCl electrode in acetonitrile was 0.456 V.

The HOMO and LUMO energy level values and the optical band gap of the cross-linked film represented by [Formula 9] were little changed after thermal cross-linking.

Example 2

Evaluation of Properties of Polymer Light Emitting Diode Employing Cross-Linked Compound Represented by [Formula 9]

After an ITO glass substrate, which was used as a cathode, was cleaned and subjected to surface treatment by exposing the surface of the glass substrate to UV, a solution prepared by dissolving the compound represented by [Formula 9] in toluene was spin-coated onto the ITO substrate. Then, the compound represented by [Formula 9] was cross-linked by heating the spin-coated ITO substrate at 240° C. for 50 minutes. Poly(9,9'-n-dioctylfluorene-alt-benzothiadiazole) (F8BT, 35 nm, 1-material) was spin-coated (formation of the emission layer) onto the cross-linked film represented by [Formula 9], and calcium (20 nm) and aluminum (80 nm) were sequentially deposited by thermal deposition under a pressure of $10^{-6}$ torr, thereby preparing a polymer light emitting diode (PLED). Here, the compound represented by [Formula 9] and a PEDOT:PSS layer had a thickness of 20 nm and 30 nm, respectively.

In Comparative Example 1, a polymer light emitting diode was prepared in the same manner except that, instead of the cross-linked film represented by [Formula 9], PEDOT:PSS (Al 4083) was spin-coated onto the substrate and annealed at 150° C. for 10 minutes.

In Comparative Example 2, a polymer light emitting diode was prepared in the same manner except that, instead of the cross-linked film represented by [Formula 9], quartz was used.

Performance of each PLED was evaluated using a Keithley 2400 programmable source meter and a Spectroscan PR 650.

(2-1) Electrical Properties

Figure 5A:
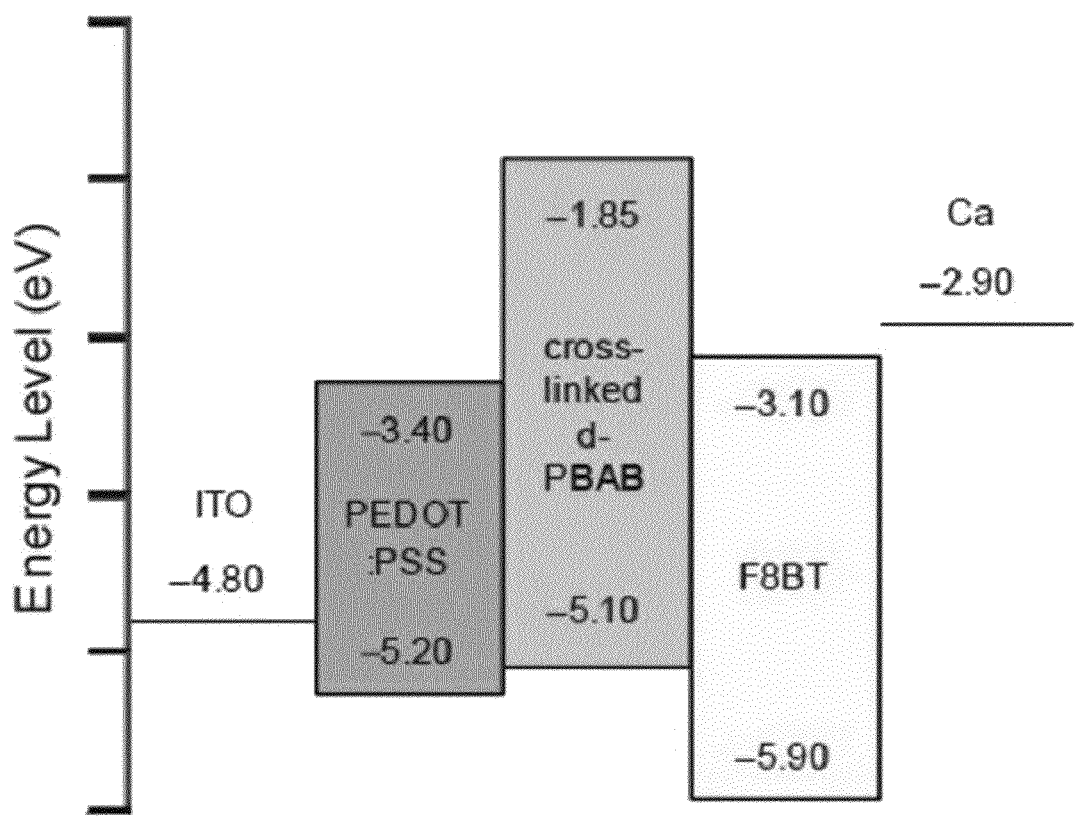
FIG. 5a is an energy-level diagram of a cross-linked film prepared from the compound represented by [Formula 9]
Figure 5B:
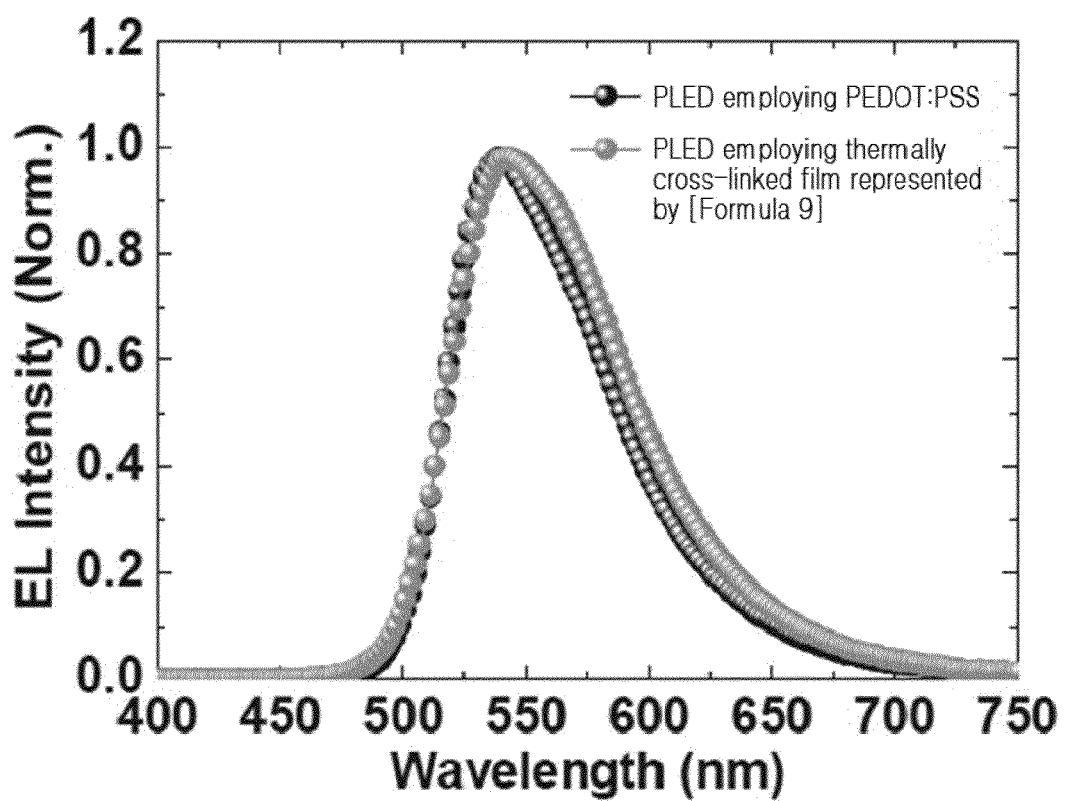
FIG. 5b is a graph depicting electroluminescence of polymer light emitting diodes employing hole transport layers prepared in one inventive example and a comparative example.
Figure 5C:
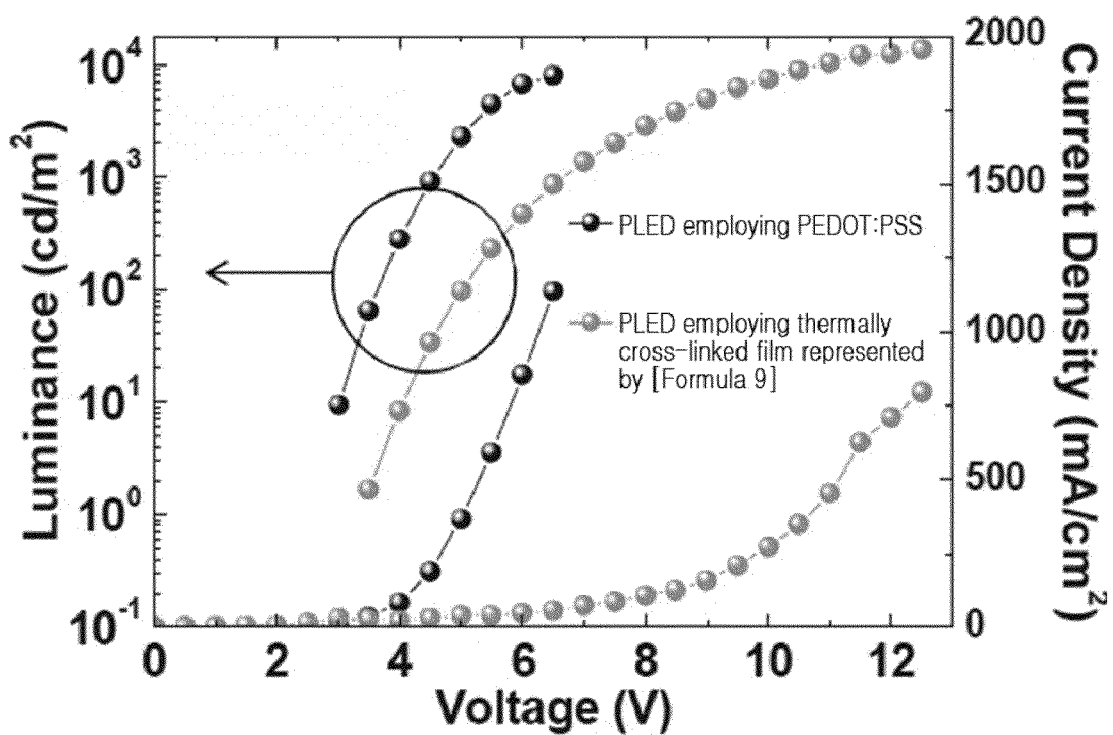
FIG. 5c is a graph depicting current density and luminance depending on voltage of the polymer light emitting diodes employing hole transport layers prepared in the inventive example and the comparative example.
Figure 5D:
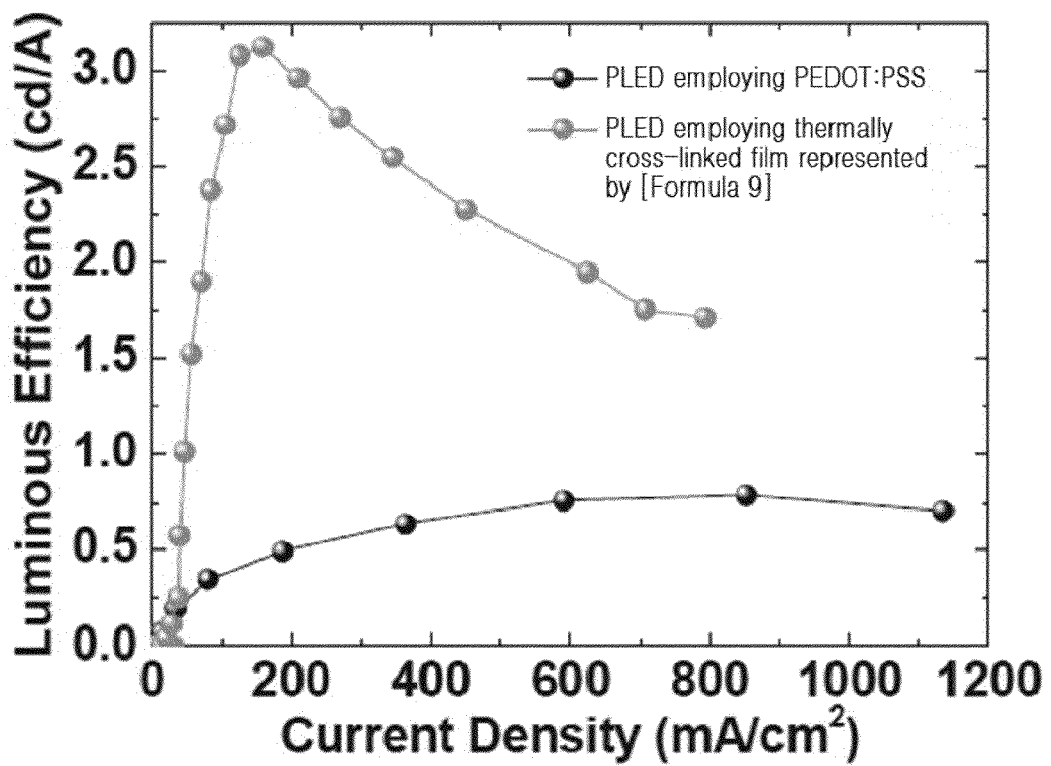
FIG. 5d is a graph depicting luminous efficiency depending on current density of the polymer light emitting diodes employing hole transport layers prepared in the inventive example and the comparative example.

FIG. 5a is an energy-level diagram of the cross-linked film prepared from the compound represented by [Formula 9], FIG. 5b is a graph depicting electroluminescence of the polymer light emitting diode, FIG. 5c is a graph depicting current density and luminance depending on voltages of the polymer light emitting diode, and FIG. 5d is a graph depicting luminous efficiency of the polymer light emitting diode depending on current density.

As shown in FIG. 5a, the cross-linked film represented by [Formula 9] had a higher LUMO energy level of -1.85 eV than PEDOT:PSS (-3.40 eV), typically used as the hole transport layer. As such, the cross-linked film represented by [Formula 9] has a higher LUMO energy level and thus functions as an effective electron blocking layer of F8BT, which is a luminescent polymer, thereby improving efficiency of the PLED. The reason for using F8BT, which is a polyfluorene derivative, as the luminescent polymer is that F8BT exhibits excellent photoelectrical properties such as processability, atmospheric stability, thermal stability, high photoluminescence efficiency, and electron mobility. Since the HOMO energy level of the cross-linked film represented by [Formula 9] is -5.10 eV, which is between that of ITO (-4.80 eV) and that of F8BT (-5.90 eV), holes can be rapidly transferred. From these results, the cross-linked film represented by [Formula 9] may be used as the hole transport layer of a high efficiency multilayer polymer light emitting diode prepared by a solution process, due to excellent solvent resistance, defect-free surface, excellent electron blocking and hole transfer capabilities.

As shown in FIG. 5b, the polymer light emitting diode (Device A) employing the cross-linked film represented by [Formula 9] as the hole transport layer and the polymer light emitting diode (Device B) employing PEDOT:PSS as the hole transport layer showed almost the same electroluminescence (EL) spectra, and light emission from the cross-linked film represented by [Formula 9] was not observed from both devices. This means that holes and electrons are recombined in the emission layer.

As shown in FIGS. 5c and 5d, Device A had a maximum luminance ($L_{max}$) of 13,600 cd/cm$^2$ and a maximum luminous efficiency of 3.2 cd/A, which were 1.5 times higher and 4 times higher than those of Device B (8,000 cd/cm$^2$, 0.78 cd/A), respectively. In addition, Device A showed a lower current density of 790 mA/cm$^2$ and a slightly higher driving voltage of 3.5 V than Device B (1,130 mA/cm$^2$, 3.0 V). That is, performance of Device A was improved. This result can be interpreted in two ways. First, since the cross-linked film represented by [Formula 9] had excellent electron and exciton blocking capabilities due to the high LUMO energy level, charge recombination in the emission layer becomes equilibrium. From the low current density of Device A, it can be confirmed that the cross-linked film represented by [Formula 9] has excellent electron blocking capability. On the contrary, in Device B, since a considerable amount of electrons were not recombined with holes, passed through the F8BT and moved to the ITO through the PEDOT:PSS layer having low electron blocking capability and high conductivity, recombination efficiency of electrons and holes is decreased in Device B, thereby lowering overall efficiency. Second, since exciton quenching is decreased at the interface between the cross-linked film represented by [Formula 9] and F8BT, photoluminescence of F8BT is improved. The reason why Device A has a slightly higher driving voltage than Device B is that the cross-linked film represented by [Formula 9] has lower hole mobility than PEDOT:PSS ($10^{-2}\sim10^{-3}$ cm$^2$/(Vs)) due to non-conjugated vinyl groups.

(2-2) Exciton Lifetime

Figure 6A:
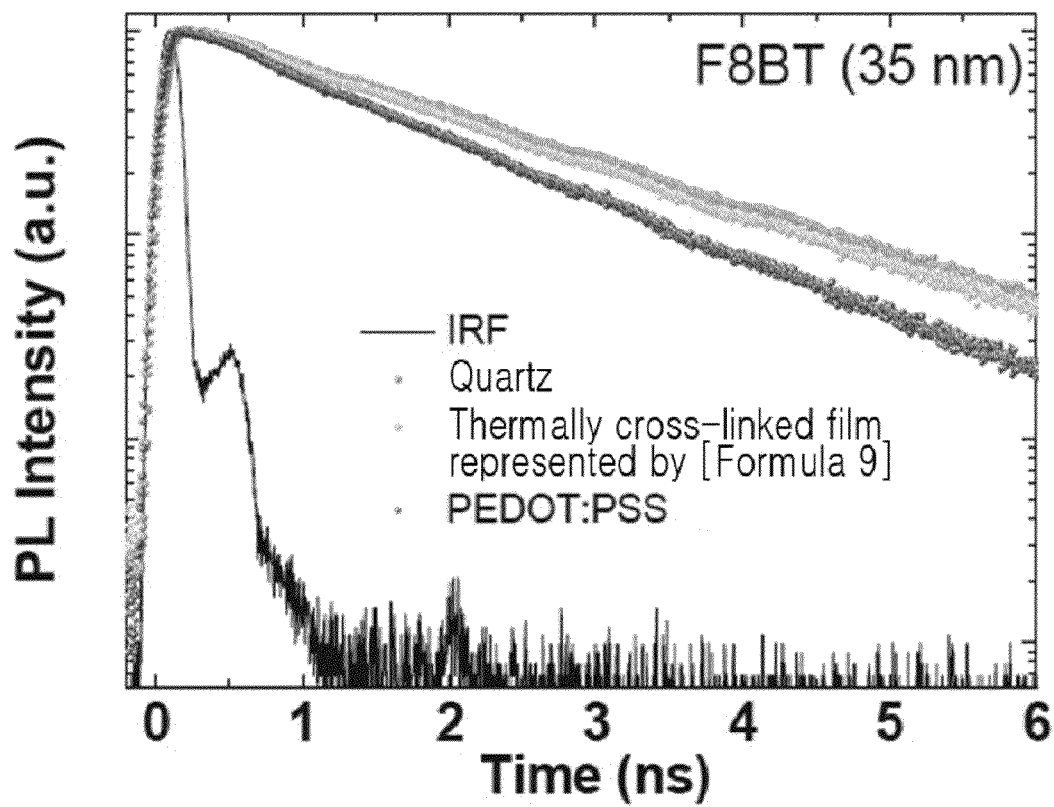
FIG. 6a is a graph depicting exciton lifetimes of 35 nm thick emission layers employing hole transport layers prepared in the inventive example and the comparative example, as measured by time-correlated single photon counting (TC-SPC)
Figure 6B:
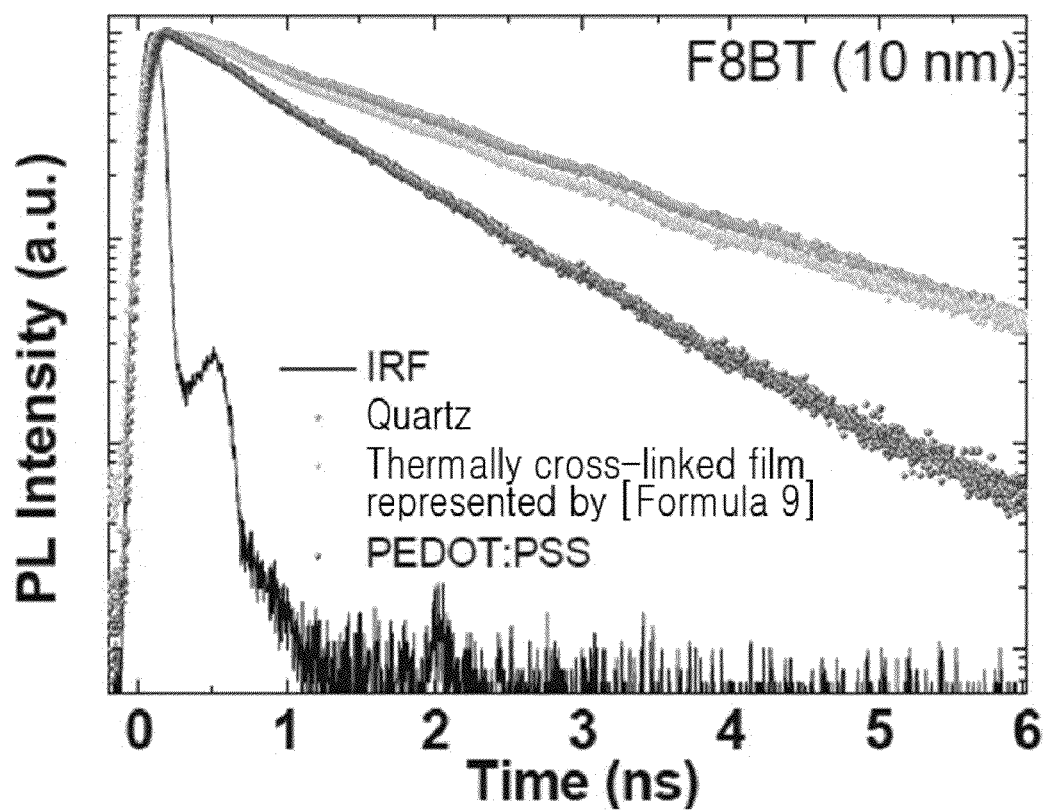
FIG. 6b is a graph depicting exciton lifetimes of 10 nm thick emission layers employing hole transport layers prepared in the inventive example and the comparative example, as measured by time-correlated single photon counting (TC-SPC)
Figure 6C:
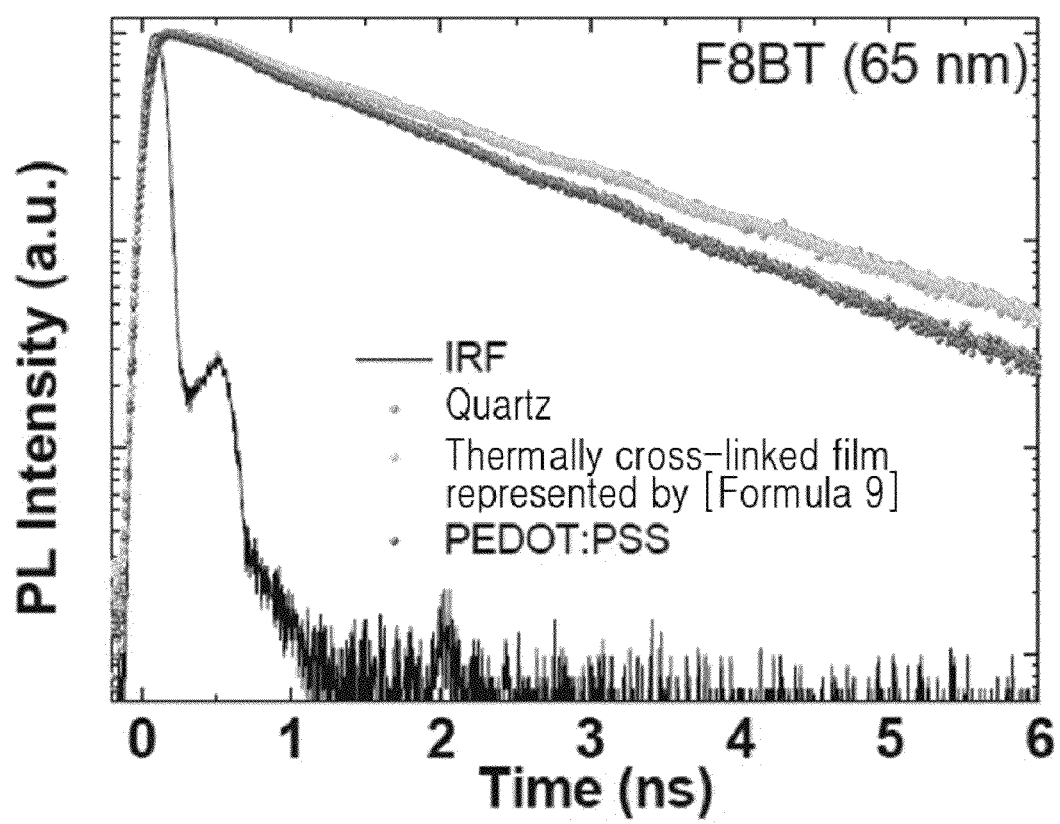
FIG. 6c is a graph depicting exciton lifetimes of 65 nm thick emission layers employing hole transport layers prepared in the inventive example and the comparative example, as measured by time-correlated single photon counting (TC-SPC)

FIG. 6a is a graph depicting exciton lifetimes of 35 nm thick F8BT employing the hole transport layers prepared in the inventive example and the comparative example, as measured by time-correlated single photon counting (TCSPC); FIG. 6b is a graph depicting exciton lifetimes of 10 nm thick F8BT employing the hole transport layers prepared in the inventive example and the comparative example, as measured by time-correlated single photon counting (TCSPC); FIG. 6c is a graph depicting exciton lifetimes of 65 nm thick F8BT employing the hole transport layers prepared in the inventive example and the comparative example, as measured by time-correlated single photon counting (TCSPC); and FIG. 6d is a graph depicting exciton lifetimes depending on thickness of the emission layer (F8BT).

In single photon counting analysis, second harmonic generation (SHG=350 nm for [Formula 1], 420 nm for F8BT) of a tunable Ti:sapphire laser (Mira900, Coherent), which has a pulse width of 150 fs or less and a repetition rate of 76 MHz, was used as an excitation source. Photoluminescence spectrum was analyzed using a photodetector and a monochromator (Acton, SP-2150i), and ultrahigh speed detection was performed using a TCSPC module (PicoQuant, PicoHarp) provided with a MCP-PMT (Hamamatsu, R3809U-59). The total IRF (instrument response function) of PL decrease was below 150 ps, and temporal resolution was below 10 ps. A time constant associated with exponential decrease was determined through deconvolution of real fluorescence decay and IRF using fitting software (FlouFit, PicoQuant).

FIG. 6a is a graph depicting exciton lifetimes measured by time-correlated single photon counting (TCSPC) to prove capabilities of the hole transport layer, which inhibits and/or reduces exciton quenching, and depicts a decrease tendency of photoluminescence (PL) of F8BT. In FIG. 6a, an exciton lifetime ($\tau_{avr}$) of the F8BT (35 nm thick) at 545 nm was 1.82 ns when quartz was used as the hole transport layer, whereas the exciton lifetime ($\tau_{avr}$) was rapidly decreased to 1.37 ns when PEDOT:PSS was used as the hole transport layer. However, when the cross-linked film represented by [Formula 9] was used as the hole transport layer, the exciton lifetime ($\tau_{avr}$) was not significantly decreased and was 1.69 ns, which was about 93% the exciton lifetime ($\tau_{avr}$) of F8BT when quartz was used. These results mean that exciton quenching of F8BT at the interface of the cross-linked film represented by [Formula 9] is much less than at the interface of PEDOT:PSS.

Figure 6D:
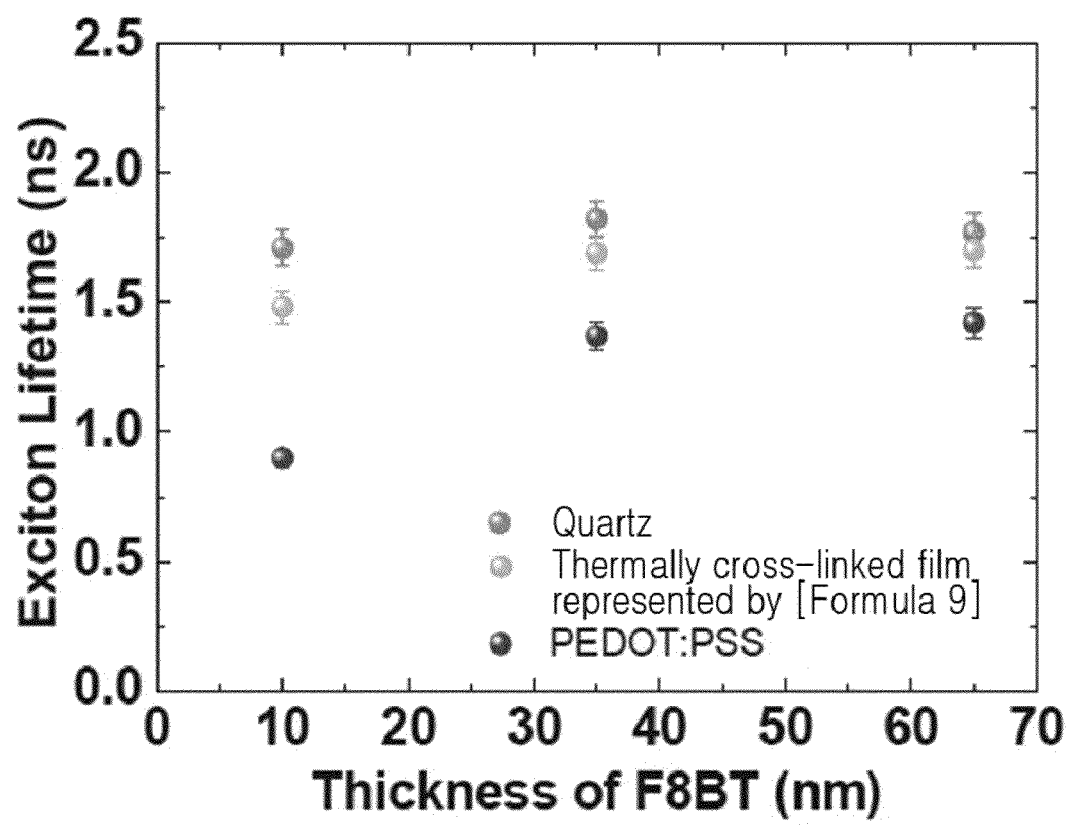
FIG. 6d is a graph depicting exciton lifetime depending on thickness of the emission layer.

As shown in FIG. 6d, when PEDOT:PSS was used as the hole transport layer, the exciton lifetime ($\tau_{avr}$) of F8BT was greatly influenced by film thicknesses of F8BT. Exciton quenching of F8BT at the interface of PEDOT:PSS in the case of a thick film thickness (65 nm) was less than in the case of a thin film thickness (10 nm). When the film thicknesses of F8BT were 10 nm and 65 nm, decrease ratios of the exciton lifetime ($\tau_{avr}$) were 47% and 20%, respectively. From these results, it can be seen that a diffusion length of the exciton of F8BT is 10 nm or less, and this value is similar to values observed in other conjugated polymers. The reason that exciton quenching of the thick F8BT film is less than that of the thin F8BT film may be that chemical/physical quenching is decreased due to an increased distance from the interface of PEDOT:PSS to the exciton of F8BT. However, when the cross-linked film represented by [Formula 9] was used as the hole transport layer, exciton quenching of F8BT was significantly decreased even though the film thickness of the F8BT was 10 nm When the film thicknesses of the F8BT were 10 nm and 65 nm, decrease ratios of the exciton lifetime ($\tau_{avr}$) were only 13% and 4%, respectively. From these results, it can be seen that the cross-linked film represented by [Formula 9] has excellent capability of inhibiting and/or reducing exciton quenching, thereby reducing non-radiation decay while improving performance of the device.

Although some embodiments have been described herein, it will be apparent to those skilled in the art that these embodiments are given by way of illustration only, and that various modifications, changes, alterations, and equivalent embodiments can be devised without departing from the spirit and scope of the invention. The scope of the invention should be limited only by the accompanying claims and equivalents thereof.

What is claimed is:

1. A hole transport polymeric compound represented by [Formula 1]:

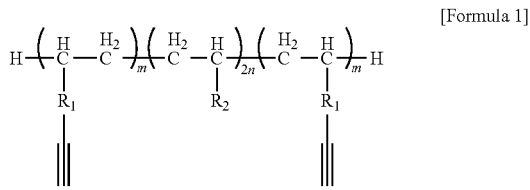

[Formula 1]

wherein $R_1$ is selected from the group comprised of a $C_1$ to $C_{30}$ alkyl group, a $C_6$ to $C_{40}$ aryl group, and a $C_2$ to $C_{30}$ heteroaryl group including N, O or S; $R_2$ is selected from the group comprised of a substituted or unsubstituted triphenyl amine and a substituted or unsubstituted carbazole; and m and n are an integer from 1 to 50.

2. The polymeric compound according to claim 1, wherein a substituent to triphenyl amine and carbazole of $R_2$ is selected from the group comprised of a $C_6$ to $C_{40}$ aryl group, a $C_2$ to $C_{30}$ heteroaryl group including N, O or S, and a triphenyl amine group.

3. The polymeric compound according to claim 1, wherein $R_2$ is selected from the group comprised of compounds represented by [Formula 2] to [Formula 5]:

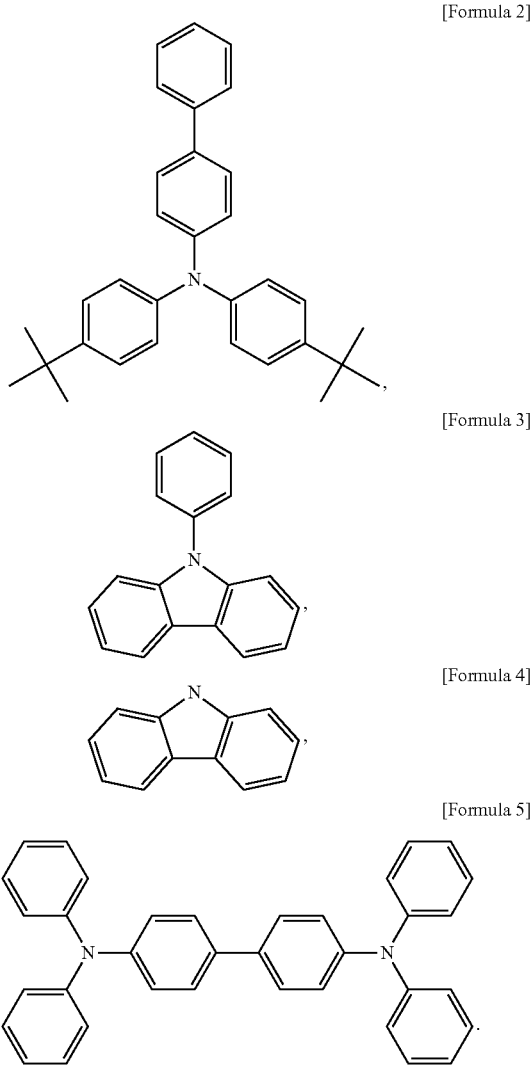

4. The polymeric compound according to claim 1, wherein the hole transport polymeric compound represented by [Formula 1] is polymerized by anionic polymerization or radical polymerization.

5. A method for preparing a hole transport polymeric compound, comprising: preparing a hole transport polymeric compound represented by [Formula 1] by reacting a compound represented by [Formula 8] with tetra-n-butylammonium fluoride according to <Reaction Formula 1>:

<Reaction Formula 1>

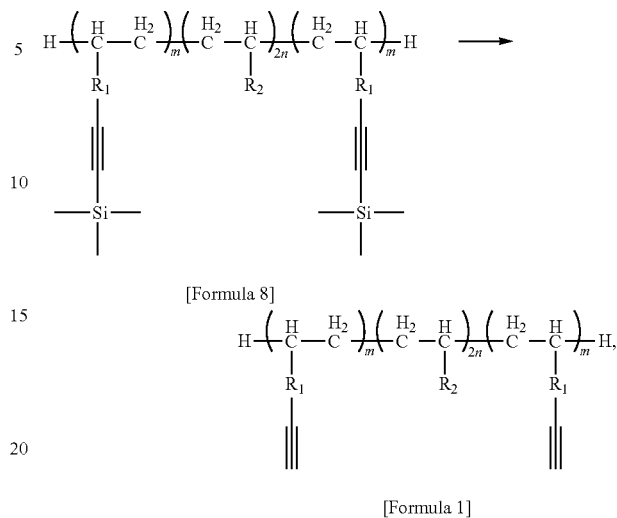

wherein $R_1$ is selected from the group comprised of a $C_1$ to $C_{30}$ alkyl group, a $C_6$ to $C_{40}$ aryl group, and a $C_2$ to $C_{30}$ heteroaryl group including N, O or S; $R_2$ is selected from the group comprised of a substituted or unsubstituted triphenyl amine and a substituted or unsubstituted carbazole; and each of m and n is an integer from 1 to 50.

6. The method according to claim 5, wherein the hole transport polymeric compound represented by [Formula 8] is prepared by reacting a polymer, in which compounds represented by [Formula 6] are continuously formed, with a compound represented by [Formula 7] in the presence of potassium naphthlenide, sec-butyllithium (sec-BuLi), or a radical initiator according to <Reaction Formula 2>:

<Reaction Formula 2>

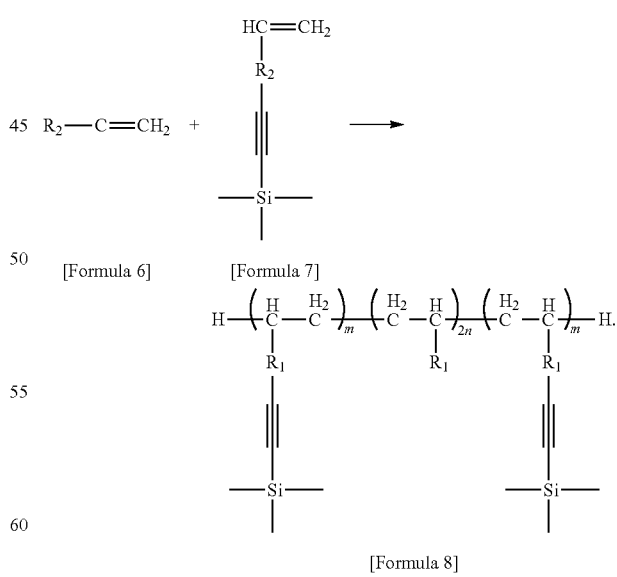

7. The method according to claim 6, wherein the polymer is prepared by reacting the compound represented by [Formula 6] with potassium naphthalenide, sec-butyllithium (sec-BuLi), or a radical initiator.

8. The method according to claim 6, wherein the compound represented by [Formula 6] and the compound represented by [Formula 7] are mixed in a molar ratio from 1:0.2 to 1:0.8.

9. The method according to claim 5, wherein $R_2$ is selected from the group comprised of hole transport compounds represented by [Formula 2] to [Formula 5].

[Formula 2]

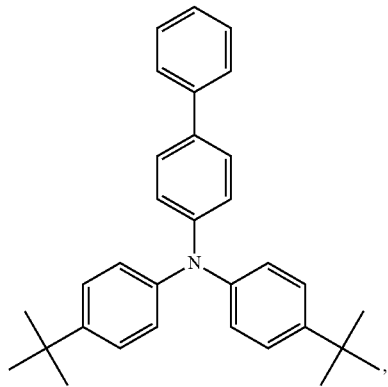

[Formula 3]

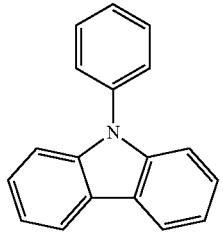

[Formula 4]

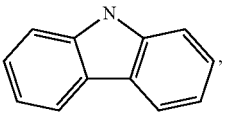

[Formula 5]

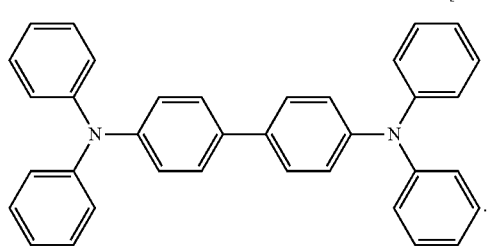

10. A polymer light emitting diode comprising: a first electrode; an organic material layer comprised of at least 2 layers including an emission layer; and a second electrode, sequentially stacked in this order, wherein at least one layer in the organic material layer comprises the compound represented by [Formula 1]:

[Formula 1]

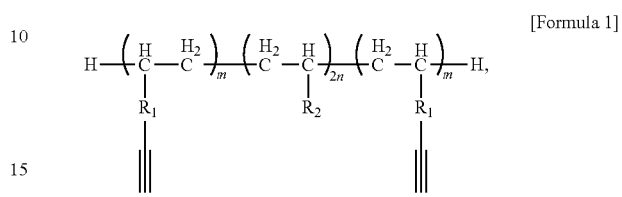

wherein $R_1$ is selected from the group comprised of a $C_1$ to $C_{30}$ alkyl group, a $C_6$ to $C_{40}$ aryl group, and a $C_2$ to $C_{30}$ heteroaryl group including N, O or S; $R_2$ is selected from the group comprised of a substituted or unsubstituted triphenyl amine and a substituted or unsubstituted carbazole; and each of m and n is an integer from 1 to 50.

11. The polymer light emitting diode according to claim 10, wherein the organic material layer comprises a hole transport layer comprising the compound represented by [Formula 1].

12. The polymer light emitting diode according to claim 10, wherein the compound represented by [Formula 1] is thermally cross-linked on the first electrode.

13. The polymer light emitting diode according to claim 12, wherein the thermal cross-linking is performed at 200° C. to 300° C. for 10 minutes to 60 minutes.

14. The polymer light emitting diode according to claim 10, wherein the emission layer has a thickness from 10 nm to 100 nm.

15. The polymer light emitting diode according to claim 10, wherein the emission layer comprises a binary compound of a host material and a phosphorescent or fluorescent dopant, the host material being the compound represented by [Formula 1].

* * * * *